(12) United States Patent
Zhang et al.

(10) Patent No.: US 10,312,177 B2
(45) Date of Patent: Jun. 4, 2019

(54) THERMAL INTERFACE MATERIALS INCLUDING A COLORING AGENT

(71) Applicants: Honeywell International Inc., Morris Plains, NJ (US); Liqiang Zhang, Shanghai (CN); Yaqin Mao, Shanghai (CN); Huifeng Duan, Shanghai (CN); Haigang Kang, Shanghai (CN); Ya Qun Liu, Shanghai (CN); Ling Shen, Shanghai (CN); Kai Zhang, Shanghai (CN)

(72) Inventors: Liqiang Zhang, Shanghai (CN); Yaqin Mao, Shanghai (CN); Huifeng Duan, Shanghai (CN); Haigang Kang, Shanghai (CN); Ya Qun Liu, Shanghai (CN); Ling Shen, Shanghai (CN); Kai Zhang, Shanghai (CN)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 15/554,806

(22) PCT Filed: Oct. 12, 2016

(86) PCT No.: PCT/CN2016/101874
§ 371 (c)(1),
(2) Date: Aug. 31, 2017

(87) PCT Pub. No.: WO2018/068222
PCT Pub. Date: Apr. 19, 2018

(65) Prior Publication Data
US 2018/0358283 A1     Dec. 13, 2018

(30) Foreign Application Priority Data
Nov. 17, 2015 (EP) .................................... 15195014

(51) Int. Cl.
*C09K 5/06* (2006.01)
*C08L 23/26* (2006.01)
(Continued)

(52) U.S. Cl.
CPC .............. *H01L 23/42* (2013.01); *C08L 23/26* (2013.01); *C09K 5/06* (2013.01); *C09K 5/063* (2013.01); *H01L 23/3737* (2013.01)

(58) Field of Classification Search
CPC . C09K 5/06; C09K 5/063; C08K 3/08; C08K 3/22; C08K 5/00; H01L 23/3737; H01L 23/42
(Continued)

(56) References Cited

U.S. PATENT DOCUMENTS

| 1,655,133 A | 1/1928 | Clase |
| 4,180,498 A | 12/1979 | Spivack |

(Continued)

FOREIGN PATENT DOCUMENTS

| CA | 2311067 A1 | 1/2001 |
| CN | 1407141 A | 4/2003 |

(Continued)

OTHER PUBLICATIONS

"Hi-Flow 225F-AC Reinforced, Phase Change Thermal Interface Material," The Bergquist Company, 1 page, available at least as early as the filing date of the present application.
(Continued)

*Primary Examiner* — Alexander O Williams
(74) *Attorney, Agent, or Firm* — Faegre Baker Daniels LLP

(57) ABSTRACT

The present disclosure provides thermal interface materials that are useful in transferring heat from heat generating electronic devices, such as computer chips, to heat dissipating structures, such as heat spreaders and heat sinks. The
(Continued)

thermal interface material also includes a coloring agent selected from the group consisting of: an iron based inorganic pigment; and an organic pigment.

20 Claims, 14 Drawing Sheets

(51) Int. Cl.
*H01L 23/373* (2006.01)
*H01L 23/42* (2006.01)

(58) Field of Classification Search
USPC .......................... 257/713, 712, 717, 721, 675
See application file for complete search history.

(56) References Cited

U.S. PATENT DOCUMENTS

| | | |
|---|---|---|
| 4,265,026 A | 5/1981 | Meyer |
| 4,446,266 A | 5/1984 | von Gentzkow et al. |
| 4,459,185 A | 7/1984 | Obata et al. |
| 4,565,610 A | 1/1986 | Nobel et al. |
| 5,162,555 A | 11/1992 | Remmers et al. |
| 5,167,851 A | 12/1992 | Jamison et al. |
| 5,562,814 A | 10/1996 | Kirby |
| 6,040,362 A | 3/2000 | Mine et al. |
| 6,096,414 A | 8/2000 | Young |
| 6,238,596 B1 | 5/2001 | Nguyen et al. |
| 6,339,120 B1 | 1/2002 | Misra et al. |
| 6,372,337 B2 | 4/2002 | Takahashi et al. |
| 6,372,997 B1 | 4/2002 | Hill et al. |
| 6,391,442 B1 | 5/2002 | Duvall et al. |
| 6,400,565 B1 | 6/2002 | Shabbir et al. |
| 6,432,320 B1 | 8/2002 | Bonsignore et al. |
| 6,432,497 B2 | 8/2002 | Bunyan |
| 6,451,422 B1 | 9/2002 | Nguyen |
| 6,475,962 B1 | 11/2002 | Khatri |
| 6,496,373 B1 | 12/2002 | Chung |
| 6,500,891 B1 | 12/2002 | Kropp et al. |
| 6,562,180 B1 | 5/2003 | Bohin et al. |
| 6,597,575 B1 | 7/2003 | Matayabas et al. |
| 6,605,238 B2 | 8/2003 | Nguyen et al. |
| 6,610,635 B2 | 8/2003 | Khatri |
| 6,616,999 B1 | 9/2003 | Freuler et al. |
| 6,617,517 B2 | 9/2003 | Hill et al. |
| 6,620,515 B2 | 9/2003 | Feng et al. |
| 6,624,224 B1 | 9/2003 | Misra |
| 6,649,325 B1 | 11/2003 | Gundale et al. |
| 6,657,297 B1 | 12/2003 | Jewram et al. |
| 6,673,434 B2 | 1/2004 | Nguyen |
| 6,706,219 B2 | 3/2004 | Nguyen |
| 6,761,928 B2 | 7/2004 | Hill et al. |
| 6,764,759 B2 | 7/2004 | Duvall et al. |
| 6,783,692 B2 | 8/2004 | Bhagwagar |
| 6,791,839 B2 | 9/2004 | Bhagwagar |
| 6,797,382 B2 | 9/2004 | Nguyen et al. |
| 6,797,758 B2 | 9/2004 | Misra et al. |
| 6,811,725 B2 | 11/2004 | Nguyen et al. |
| 6,815,486 B2 | 11/2004 | Bhagwagar et al. |
| 6,835,453 B2 | 12/2004 | Greenwood et al. |
| 6,838,182 B2 | 1/2005 | Kropp et al. |
| 6,874,573 B2 | 4/2005 | Collins et al. |
| 6,900,163 B2 | 5/2005 | Khatri |
| 6,913,686 B2 | 7/2005 | Hilgarth |
| 6,926,955 B2 | 8/2005 | Jayaraman et al. |
| 6,940,721 B2 | 9/2005 | Hill |
| 6,946,190 B2 | 9/2005 | Bunyan |
| 6,975,944 B1 * | 12/2005 | Zenhausern ....... G01N 33/0034 702/22 |
| 6,984,685 B2 | 1/2006 | Misra et al. |
| 7,013,965 B2 | 3/2006 | Zhong et al. |
| 7,056,566 B2 | 6/2006 | Freuler et al. |
| 7,074,490 B2 | 7/2006 | Feng et al. |
| 7,078,109 B2 | 7/2006 | Hill et al. |
| 7,135,232 B2 | 11/2006 | Yamada et al. |
| 7,147,367 B2 | 12/2006 | Balian et al. |
| 7,172,711 B2 | 2/2007 | Nguyen |
| 7,241,707 B2 | 7/2007 | Meagley et al. |
| 7,244,491 B2 | 7/2007 | Nguyen |
| 7,291,396 B2 | 11/2007 | Huang et al. |
| 7,294,394 B2 | 11/2007 | Jayaraman et al. |
| RE39,992 E | 1/2008 | Misra et al. |
| 7,328,547 B2 | 2/2008 | Mehta et al. |
| 7,369,411 B2 | 5/2008 | Hill et al. |
| 7,462,294 B2 | 12/2008 | Kumar et al. |
| 7,465,605 B2 | 12/2008 | Raravikar et al. |
| 7,550,097 B2 | 6/2009 | Tonapi et al. |
| 7,572,494 B2 | 8/2009 | Mehta et al. |
| 7,641,811 B2 | 1/2010 | Kumar et al. |
| 7,682,690 B2 | 3/2010 | Bunyan et al. |
| 7,695,817 B2 | 4/2010 | Lin et al. |
| 7,700,943 B2 | 4/2010 | Raravikar et al. |
| 7,744,991 B2 | 6/2010 | Fischer et al. |
| RE41,576 E | 8/2010 | Bunyan et al. |
| 7,816,785 B2 | 10/2010 | Iruvanti et al. |
| 7,846,778 B2 | 12/2010 | Rumer et al. |
| 7,850,870 B2 | 12/2010 | Ahn et al. |
| 7,867,609 B2 | 1/2011 | Nguyen |
| 7,955,900 B2 | 6/2011 | Jadhav et al. |
| 7,960,019 B2 | 6/2011 | Jayaraman et al. |
| 8,039,961 B2 | 10/2011 | Suhir et al. |
| 8,076,773 B2 | 12/2011 | Jewram et al. |
| 8,081,468 B2 | 12/2011 | Hill et al. |
| 8,105,504 B2 | 1/2012 | Gerster et al. |
| 8,110,919 B2 | 2/2012 | Jewram et al. |
| 8,138,239 B2 | 3/2012 | Prack et al. |
| 8,223,498 B2 | 7/2012 | Lima |
| 8,308,861 B2 | 11/2012 | Rolland et al. |
| 8,324,313 B2 | 12/2012 | Funahashi |
| 8,373,283 B2 | 2/2013 | Masuko et al. |
| 8,431,647 B2 | 4/2013 | Dumont et al. |
| 8,431,655 B2 | 4/2013 | Dershem |
| 8,445,102 B2 | 5/2013 | Strader et al. |
| 8,518,302 B2 | 8/2013 | Gerster et al. |
| 8,535,478 B2 | 9/2013 | Pouchelon et al. |
| 8,535,787 B1 | 9/2013 | Lima |
| 8,557,896 B2 | 10/2013 | Jeong et al. |
| 8,586,650 B2 | 11/2013 | Zhang et al. |
| 8,587,945 B1 | 11/2013 | Hartmann et al. |
| 8,618,211 B2 | 12/2013 | Bhagwagar et al. |
| 8,632,879 B2 | 1/2014 | Weisenberger |
| 8,633,478 B2 | 1/2014 | Cummings et al. |
| 8,638,001 B2 | 1/2014 | Kimura et al. |
| 8,647,752 B2 | 2/2014 | Strader et al. |
| 8,758,892 B2 | 6/2014 | Bergin et al. |
| 8,796,068 B2 | 8/2014 | Stender et al. |
| 8,837,151 B2 | 9/2014 | Hill et al. |
| 8,865,800 B2 | 10/2014 | Stammer et al. |
| 8,917,510 B2 | 12/2014 | Boday et al. |
| 8,937,384 B2 | 1/2015 | Bao et al. |
| 9,055,694 B2 | 6/2015 | Lima |
| 9,070,660 B2 | 6/2015 | Lowe et al. |
| 9,080,000 B2 | 7/2015 | Ahn et al. |
| 9,222,735 B2 | 12/2015 | Hill et al. |
| 9,260,645 B2 | 2/2016 | Bruzda |
| 9,392,730 B2 | 7/2016 | Hartmann et al. |
| 9,481,851 B2 | 11/2016 | Matsumoto et al. |
| 9,527,988 B2 | 12/2016 | Habimana et al. |
| 9,537,095 B2 | 1/2017 | Stender et al. |
| 9,593,209 B2 | 3/2017 | Dent et al. |
| 9,593,275 B2 | 3/2017 | Tang et al. |
| 9,598,575 B2 | 3/2017 | Bhagwagar et al. |
| 2002/0018885 A1 | 2/2002 | Takahashi et al. |
| 2002/0132896 A1 | 9/2002 | Nguyen |
| 2003/0112603 A1 | 6/2003 | Roesner et al. |
| 2003/0151030 A1 | 8/2003 | Gurin |
| 2003/0159938 A1 | 8/2003 | Hradil |
| 2003/0203181 A1 | 10/2003 | Ellsworth et al. |
| 2003/0207064 A1 | 11/2003 | Bunyan et al. |
| 2003/0207128 A1 | 11/2003 | Uchiya et al. |
| 2003/0230403 A1 | 12/2003 | Webb |
| 2004/0069454 A1 | 4/2004 | Bonsignore et al. |
| 2004/0097635 A1 | 5/2004 | Fan et al. |
| 2004/0149587 A1 | 8/2004 | Hradil |

(56) References Cited

U.S. PATENT DOCUMENTS

| | | |
|---|---|---|
| 2004/0161571 A1 | 8/2004 | Duvall et al. |
| 2004/0206941 A1 | 10/2004 | Gurin |
| 2005/0020738 A1 | 1/2005 | Jackson et al. |
| 2005/0025984 A1* | 2/2005 | Odell ................ C08G 73/106 428/447 |
| 2005/0072334 A1 | 4/2005 | Czubarow et al. |
| 2005/0148721 A1 | 7/2005 | Tonapi et al. |
| 2005/0228097 A1 | 10/2005 | Zhong |
| 2005/0287362 A1 | 12/2005 | Garcia-Ramirez et al. |
| 2006/0208354 A1 | 9/2006 | Liu et al. |
| 2006/0228542 A1 | 10/2006 | Czubarow |
| 2006/0260948 A2 | 11/2006 | Zschintzsch et al. |
| 2006/0264566 A1 | 11/2006 | Cassar et al. |
| 2007/0051773 A1 | 3/2007 | Ruchert et al. |
| 2007/0097651 A1 | 5/2007 | Canale et al. |
| 2007/0131913 A1 | 6/2007 | Cheng et al. |
| 2007/0161521 A1 | 7/2007 | Sachdev et al. |
| 2007/0164424 A1 | 7/2007 | Dean et al. |
| 2007/0179232 A1 | 8/2007 | Collins et al. |
| 2007/0249753 A1 | 10/2007 | Lin et al. |
| 2008/0044670 A1 | 2/2008 | Nguyen |
| 2008/0141629 A1 | 6/2008 | Alper et al. |
| 2008/0149176 A1 | 6/2008 | Sager et al. |
| 2008/0291634 A1 | 11/2008 | Weiser et al. |
| 2008/0302064 A1 | 12/2008 | Rauch |
| 2009/0111925 A1 | 4/2009 | Burnham et al. |
| 2009/0184283 A1 | 7/2009 | Chung et al. |
| 2010/0048435 A1 | 2/2010 | Yamagata et al. |
| 2010/0048438 A1 | 2/2010 | Carey et al. |
| 2010/0075135 A1 | 3/2010 | Kendall et al. |
| 2010/0129648 A1 | 5/2010 | Xu et al. |
| 2010/0197533 A1 | 8/2010 | Kendall et al. |
| 2011/0121435 A1 | 5/2011 | Mitsukura et al. |
| 2011/0141698 A1 | 6/2011 | Chiou et al. |
| 2011/0187009 A1 | 8/2011 | Masuko et al. |
| 2011/0204280 A1 | 8/2011 | Bruzda |
| 2011/0265979 A1 | 11/2011 | Chen et al. |
| 2011/0294958 A1 | 12/2011 | Ahn et al. |
| 2011/0308782 A1 | 12/2011 | Merrill et al. |
| 2012/0060826 A1 | 3/2012 | Weisenberger |
| 2012/0195822 A1 | 8/2012 | Werner et al. |
| 2012/0253033 A1 | 10/2012 | Boucher et al. |
| 2012/0285673 A1 | 11/2012 | Cola et al. |
| 2012/0288725 A1 | 11/2012 | Tanaka et al. |
| 2013/0199724 A1 | 8/2013 | Dershem |
| 2013/0248163 A1 | 9/2013 | Bhagwagar et al. |
| 2013/0265721 A1 | 10/2013 | Strader et al. |
| 2013/0288462 A1 | 10/2013 | Stender et al. |
| 2013/0299140 A1* | 11/2013 | Ling .................... F28F 3/00 165/135 |
| 2014/0190672 A1 | 7/2014 | Swaroop et al. |
| 2015/0125646 A1 | 5/2015 | Tournilhac et al. |
| 2015/0138739 A1 | 5/2015 | Hishiki |
| 2015/0158982 A1 | 6/2015 | Saito et al. |
| 2015/0275060 A1 | 10/2015 | Kuroda et al. |
| 2015/0279762 A1 | 10/2015 | Lowe et al. |
| 2016/0160102 A1 | 6/2016 | Minegishi et al. |
| 2016/0160104 A1 | 6/2016 | Bruzda et al. |
| 2016/0226114 A1 | 8/2016 | Hartmann et al. |
| 2016/0272839 A1 | 9/2016 | Yamamoto et al. |
| 2017/0009362 A1 | 1/2017 | Werner et al. |
| 2017/0107415 A1* | 4/2017 | Shiono ................ H01L 23/3737 |
| 2017/0137685 A1 | 5/2017 | Liu et al. |
| 2017/0167716 A1* | 6/2017 | Ezaki .................. C09K 5/14 |
| 2017/0226396 A1 | 8/2017 | Yang et al. |
| 2017/0317257 A1* | 11/2017 | Ezaki .................. F28F 21/06 |
| 2017/0321100 A1 | 11/2017 | Zhang et al. |
| 2018/0030327 A1 | 2/2018 | Zhang et al. |
| 2018/0030328 A1 | 2/2018 | Zhang et al. |
| 2018/0085977 A1* | 3/2018 | Ezaki .................. B32B 15/08 |
| 2018/0194982 A1* | 7/2018 | Ezaki .................. C08K 3/00 |
| 2018/0267315 A1* | 9/2018 | Yonemura .......... G02B 27/0172 |

FOREIGN PATENT DOCUMENTS

| | | |
|---|---|---|
| CN | 1456710 A | 11/2003 |
| CN | 1549875 A | 11/2004 |
| CN | 1970666 A | 5/2007 |
| CN | 101067030 A | 11/2007 |
| CN | 101090922 B | 12/2007 |
| CN | 101445627 A | 6/2009 |
| CN | 101735619 B | 6/2010 |
| CN | 101835830 B | 9/2010 |
| CN | 102134474 B | 7/2011 |
| CN | 102341474 B | 2/2012 |
| CN | 102627943 A | 8/2012 |
| CN | 102348763 B | 4/2013 |
| CN | 103087389 A | 5/2013 |
| CN | 103102689 A | 5/2013 |
| CN | 103131138 B | 6/2013 |
| CN | 103214848 A | 7/2013 |
| CN | 103254647 A | 8/2013 |
| CN | 103333447 A | 10/2013 |
| CN | 103409116 B | 11/2013 |
| CN | 103436027 B | 12/2013 |
| CN | 103709757 A | 4/2014 |
| CN | 103773322 A | 5/2014 |
| CN | 103849356 A | 6/2014 |
| CN | 103865271 B | 6/2014 |
| CN | 104098914 A | 10/2014 |
| CN | 104140678 B | 11/2014 |
| CN | 104449550 A | 3/2015 |
| CN | 104497574 A | 4/2015 |
| CN | 104804705 A | 7/2015 |
| CN | 104861661 A | 8/2015 |
| CN | 105111750 A | 12/2015 |
| CN | 105349113 A | 2/2016 |
| CN | 105838322 A | 8/2016 |
| CN | 105980512 A | 9/2016 |
| EP | 1224669 B1 | 7/2002 |
| EP | 1149519 B1 | 11/2004 |
| EP | 1514956 B1 | 3/2005 |
| EP | 1629059 B1 | 3/2006 |
| EP | 2194165 A1 | 6/2010 |
| FR | 2848215 A1 | 6/2004 |
| GB | 2508320 B | 5/2014 |
| JP | 57027188 B | 6/1982 |
| JP | 3662715 B2 | 1/1991 |
| JP | 02611364 B2 | 5/1997 |
| JP | 2000143808 A | 5/2000 |
| JP | 2001139818 A | 5/2001 |
| JP | 2002003830 A | 1/2002 |
| JP | 2007002002 A | 1/2007 |
| JP | 4016326 B2 | 12/2007 |
| JP | 2008063412 A | 3/2008 |
| JP | 5269366 B2 | 3/2009 |
| JP | 2009102577 A | 5/2009 |
| JP | 5137538 B2 | 6/2009 |
| JP | 2009138036 A | 6/2009 |
| JP | 4288469 B2 | 7/2009 |
| JP | 5607298 B2 | 3/2010 |
| JP | 5390202 B2 | 8/2010 |
| JP | 2010248277 A | 11/2010 |
| JP | 2010278115 A | 12/2010 |
| JP | 5318733 B2 | 6/2011 |
| JP | 2011165792 A | 8/2011 |
| JP | 5687167 B2 | 4/2013 |
| JP | 5463116 B2 | 4/2014 |
| JP | 5944306 B2 | 7/2014 |
| JP | 5372270 B1 | 9/2014 |
| JP | 2014194006 A | 10/2014 |
| KR | 100479857 B1 | 7/2003 |
| KR | 20070116654 A | 12/2007 |
| TW | 201527309 A | 7/2015 |
| WO | WO0120618 A1 | 3/2001 |
| WO | 2003064148 A1 | 8/2003 |
| WO | 2004008497 A2 | 1/2004 |
| WO | 2004022330 A1 | 3/2004 |
| WO | 200511146 A1 | 11/2005 |
| WO | 2005119771 A1 | 12/2005 |
| WO | 2007027670 A1 | 3/2007 |
| WO | 2008014171 A2 | 1/2008 |

(56) References Cited

FOREIGN PATENT DOCUMENTS

| WO | 2008121491 | A1 | | 10/2008 | |
|---|---|---|---|---|---|
| WO | 2008121970 | A1 | | 10/2008 | |
| WO | 2009032212 | A1 | | 3/2009 | |
| WO | 2013191116 | A1 | | 12/2013 | |
| WO | 2014160067 | A1 | | 10/2014 | |
| WO | 2015179056 | A1 | | 11/2015 | |
| WO | 2016004565 | A1 | | 1/2016 | |
| WO | 2016103424 | A1 | | 6/2016 | |
| WO | 2018068222 | A1 | * | 4/2018 | ............... C09K 5/06 |

OTHER PUBLICATIONS

"Therm-A-Gap HCS10,569,570,579 and 580 Thermally Conductive Gap Filler Pads," Parker Chomerics, Engineering Your Success, pp. 11-12, available at least as early as the filing date of the present application.
Aranzabe, Estibaliz, et al. "More than Color: Pigments with Thermal Storage Capacity; Processing and Degradation Behavior." Advances in Materials Physics and Chemistry, 5:171-184, 2015.
Gowda, Arun, et al. "Choosing the Right Thermal Interface Material." Solid State Technology, Insights for Electronics Manufacturing, Online Blog, 9 pages, 2005. Retrieved May 25, 2017 from the Internet <http://electroiq.com/blog/2005/03/choosing-the-right-thermal-interface-material/.
International Search Report and Written Opinion dated in PCT/CN2014/093138, dated Sep. 6, 2015, 8 pages.
International Search Report and Written Opinion dated in PCT/CN2016/101874, dated Apr. 28, 2017, 12 pages.
Ramaswamy, C., et al. "Phase Change Materials as a Viable Thermal Interface Material for High-Power Electronic Applications." The Ninth Intersociety Conference on Thermal and Thermomechanical Phenomena in Electronic Systems, IEEE, 2:687-691, 2004.
International Search Report and Written Opinion issued in PCT/US2017/041498, dated Oct. 20, 2017, 10 pages.
Ping, Ding, et al. "Preparation and Application Research of Novel Silicone Gel for High-Power IGBT." Insulating Materials, 47(2):52-55, Chinese text with English translation of Abstract, 2014.
Extended European Search Report issued in EP Application 14867847.7, dated Jun. 26, 2017, 7 pages.
International Search Report and Written Opinion issued in PCT/CN2014/081724. dated Apr. 1, 2015, 12 pages.
International Search Report and Written Opinion issued in PCT/US2014/068033, dated Mar. 26, 2015, 12 pages.
Martyak et al., On the oxidation of tin(II) in methanesulfonate solutions and the role of sulfate, Galvanotechnik (2005), 96(3), 594-601 (Abstract).
Search Report issued in CN application 201480066502.2, dated May 18, 2017, 2 pages.
"Dynasylan 1146: Oligomeric Diamino-Silane-System" Evonik Industries, pp. 1-3, 2008.
"Semicosil 9212A." Wacker Silicones Material Safety Data Sheet, pp. 1-8, printed Dec. 11, 2009.
"Semicosil 9212B." Wacker Silicones Material Safety Data Sheet, pp. 1-8, printed Dec. 11, 2009.
Extended European Search Report issued in EP Application No. 14897036.1, dated Jul. 2, 2018, 7 pages.
Extended Search Report issued in EP Application 14907530.1, dated Jun. 27, 2018, 9 pages.
Fink, Johannes Karl. "Chapter 18: Metal Deactivators." in: A Concise Introduction to Additives for Thermoplastic Polymers, Wiley-Scrivener, pp. 165-171, Jan. 1, 2010.
Singaporean Search Report and Written Opinion issued in SG Application No. 11201704238Y, completed May, 18, 2018, 9 pages.
Yasuhiro Aoyagi et al., "Effects of antioxidants and the solild component on the thermal stability of polyol-ester-based thermal pastes", J Mater Sci (2007) 42:2358-2375; Mar. 12, 2007.
Yasuhiro Aoyagi et al., "Polyol-Based Phase-Change Thermal Interface Materials", Journal of Electronic Materials, vol. 35, No. 3, (2006); pp. 416-424.
Yunsheng Xu et al., "Lithium Doped Polyethylene-Glycol-Based Thermal Interface Pastes for High Thermal Contact Conductance", Transactions of the ASME; Journal of Electronic Packagiing, vol. 124, Sep. 2002; pp. 188-191.

* cited by examiner

THERMAL INTERFACE MATERIALS INCLUDING A COLORING AGENT

CROSS-REFERENCE TO RELATED APPLICATION

This application is the U.S. national stage of PCT/CN2016/101874, filed Oct. 12, 2016, the entire disclosure of which is hereby incorporated by reference.

FIELD OF THE INVENTION

The present disclosure relates generally to thermal interface materials for use in electronic components, and more particularly to thermal interface materials including a coloring agent.

DESCRIPTION OF THE RELATED ART

Thermal interface materials (TIMs) are widely used to dissipate heat from electronic components, such as central processing units, video graphics arrays, servers, game consoles, smart phones, LED boards, and the like. Thermal interface materials are typically used to transfer excess heat from the electronic component to a heat spreader, such as a heat sink.

A typical electronics package structure 10 including thermal interface materials is illustrated in FIG. 1. The electronics package structure 10 illustratively includes a heat generating component, such as an electronic chip 12, and one or more heat dissipating components, such as a heat spreader 14, and a heat sink 16. Illustrative heat spreaders 14 and heat sinks comprise a metal, metal alloy, or metal-plated substrate, such as copper, copper alloy, aluminum, aluminum alloy, or nickel-plated copper. TIM materials, such as TIM 18 and TIM 20, provide a thermal connection between the heat generating component and the one or more heat dissipating components. Electronics package structure 10 includes a first TIM 18 connecting the electronic chip 12 and heat spreader 14. TIM 18 is typically referred to as a "TIM 1". Electronics package structure 10 includes a second TIM 20 connecting the heat spreader 14 and heat sink 16. TIM 18 is typically referred to as a "TIM 2". In another embodiment, electronics package structure 10 does not include a heat spreader 14, and a TIM (not shown) connects the electronic chip 12 directly to the heat sink 16. Such a TIM connecting the electronic chip 12 directly to the heat sink 16 is typically referred to as a TIM 1.5.

Thermal interface materials include thermal grease, grease-like materials, elastomer tapes, and phase change materials. Traditional thermal interface materials include components such as gap pads and thermal pads.

Typical TIM materials include a relatively high loading of a thermally conductive filler, such as aluminum particles, providing a grey color to the TIM. In a typical application, the substrate may have a similar grey color as the TIM material, making it difficult for an operator to visually distinguish or an automatic color recognition machine to judge the TIM from the substrate when transferring the TIM onto the substrate or after the TIM has been transferred to the substrate. For thermal interface materials including a white colored filler, such as $Al_2O_3$, ZnO, or BN, typical pigments may provide adequate color differentiation. However, in thermal interface materials including a darker colored filler, such as aluminum (grey) or carbon black (black), the dark filler colors can cover typical pigments, and little to no color is observed, particularly at relatively high loadings of dark colored fillers.

Improvements in the foregoing are desired.

SUMMARY OF THE INVENTION

The present disclosure provides thermal interface materials that are useful in transferring heat from heat generating electronic devices, such as computer chips, to heat dissipating structures, such as heat spreaders and heat sinks. The thermal interface material includes a coloring agent.

According to an embodiment of the present disclosure, the thermal interface material includes at least one polymer; at least one thermally conductive filler; and at least one coloring agent selected from the group consisting of: an iron based inorganic pigment; and an organic pigment. In one more particular embodiment, the iron based inorganic pigment is an iron oxide pigment selected from the group consisting of: $\alpha\text{-}Fe_2O_3$; $\alpha\text{-}Fe_2O_3 \cdot H_2O$; $Fe_3O_4$. In one more particular embodiment of any of the above embodiments, the organic pigment has a formula selected from the group consisting of Formulas (I)-(XVI):

Formula (I)

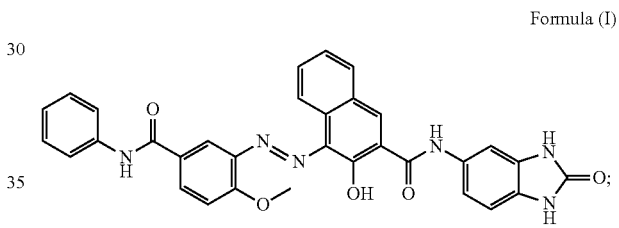

Formula (II)

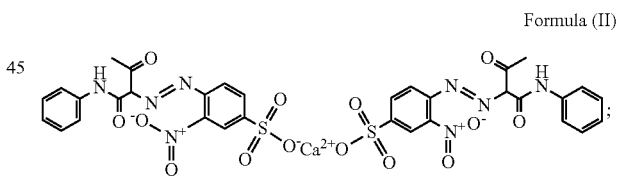

Formula (III)

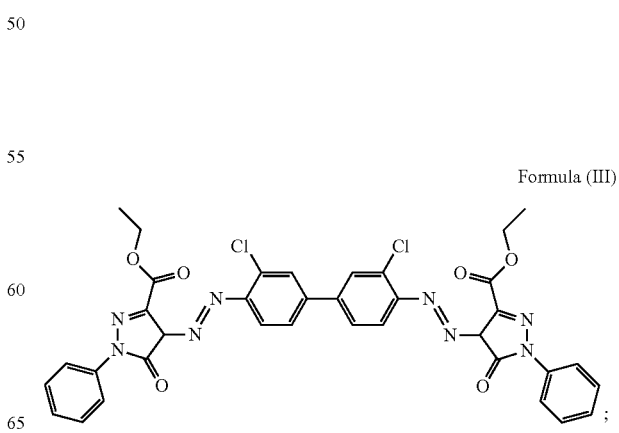

Formula (IV)
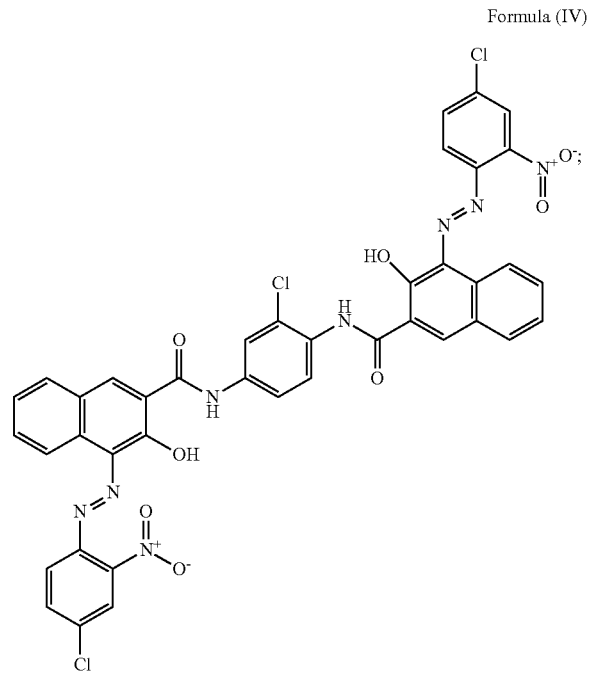
Formula (V)
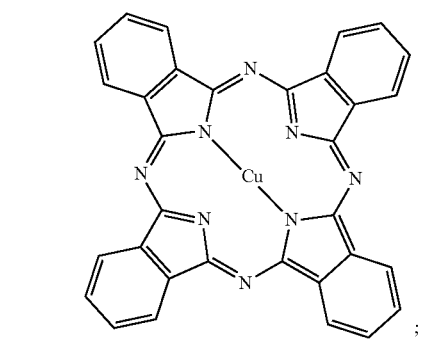
Formula (VI)
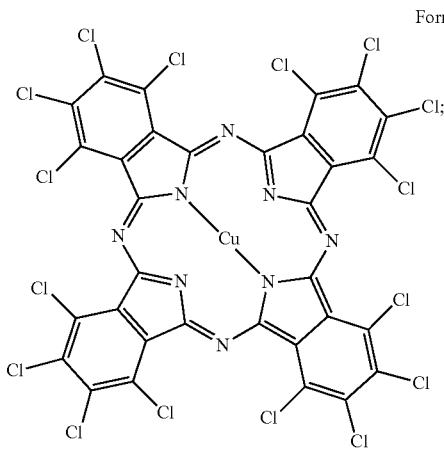
Formula (VII)
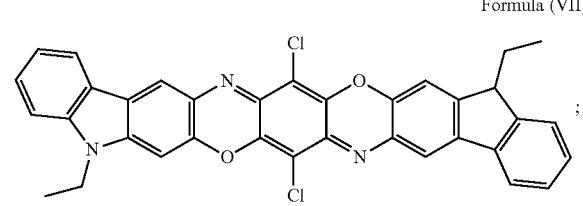
Formula (VIII)
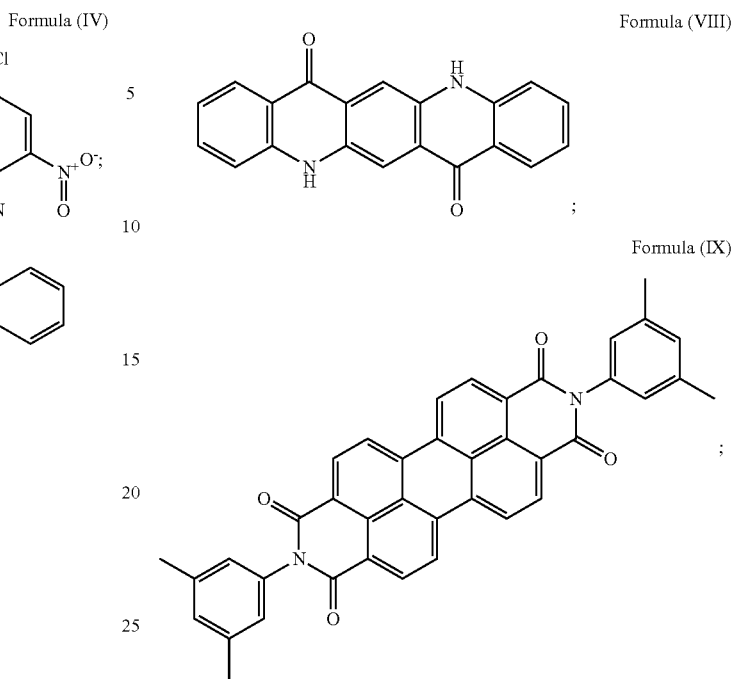
Formula (IX)
Formula (X)
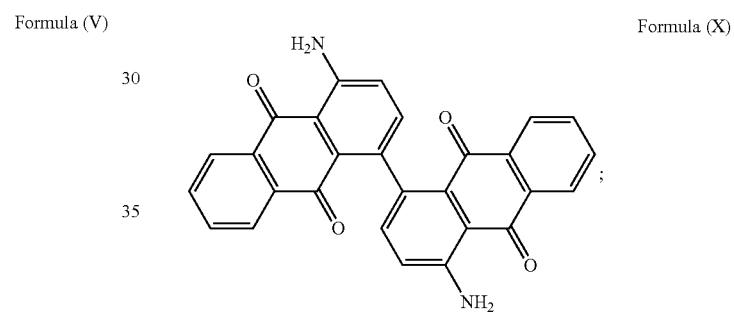
Formula (XI)
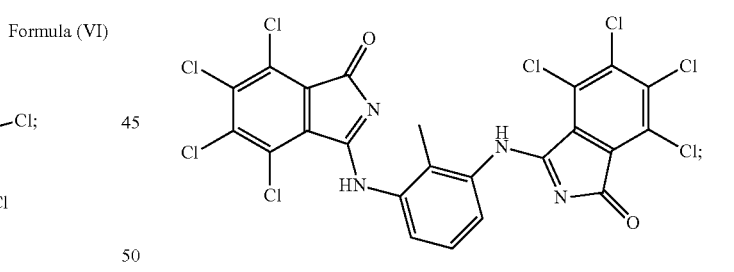
Formula (XII)
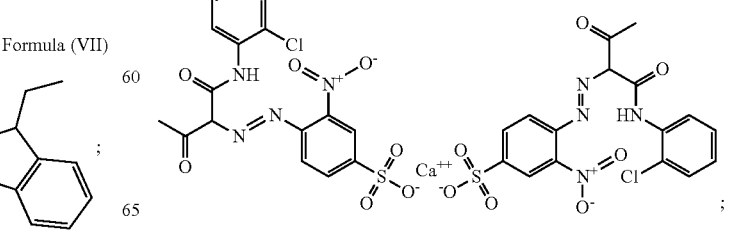

-continued

Formula (XIII)

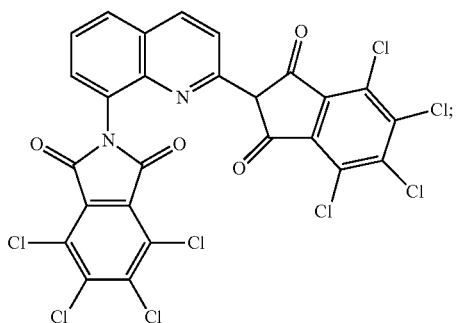

Formula (XIV)

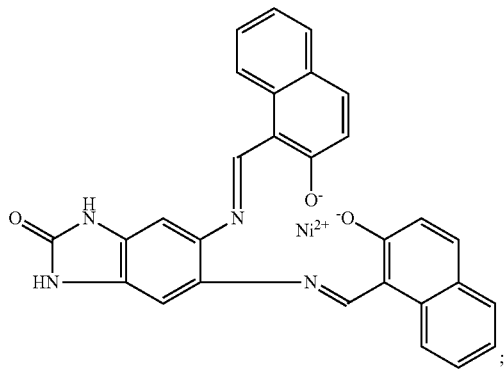

Formula (XV)

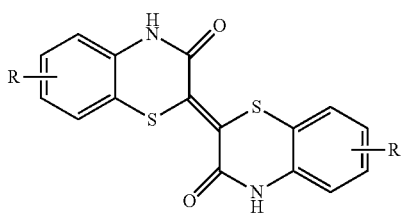

wherein each R is independently selected from H, alkyl, aryl, and halogen; and

Formula (XVI)

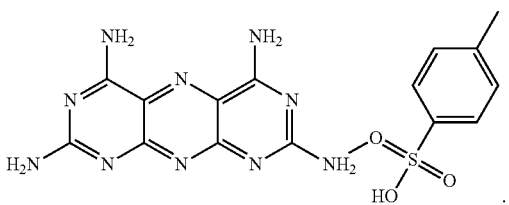

In one more particular embodiment, the coloring agent is selected from the group consisting of: α-$Fe_2O_3$; α-$Fe_2O_3.H_2O$; $Fe_3O_4$; and Formula (I). In one more particular embodiment of any of the above embodiments, the coloring agent is an organic pigment of Formula (I). In one more particular embodiment of any of the above embodiments, the thermal interface material comprises 0.5 wt. % to 2 wt. % of the coloring agent based on 100 wt. % of the thermal interface material without the coloring agent.

In one more particular embodiment of any of the above embodiments, the coloring agent is selected from the group consisting of: α-$Fe_2O3$; α-$Fe_2O_3.H_2O$ and $Fe_3O_4$.

In one more particular embodiment of any of the above embodiments the coloring agent is $Fe_3O_4$. In one more particular embodiment of any of the above embodiments, the thermal interface material comprises 1 wt. % to 20 wt. % of the coloring agent based on 100 wt. % of the thermal interface material without the coloring agent.

In one more particular embodiment of any of the above embodiments, the thermally conductive filler comprises aluminum particles. In one more particular embodiment of any of the above embodiments, the aluminum particles comprises at least 80 wt. % of the thermal interface material, based on 100 wt. % of the thermal interface material without the coloring agent.

In one more particular embodiment of any of the above embodiments, the thermal interface material has a thermal impedance of 0.05° C.·$cm^2$/W to 0.3° C.·$cm^2$/W. In one more particular embodiment of any of the above embodiments, the thermal interface material comprises: 5 wt. % to 10 wt. % of the at least one polymer; 85 wt. % to 95 wt. % of the at least one thermally conductive filler; 0.1 wt. % and 5 wt. % of a phase change material; and 0.5 wt. % to 20 wt. % of the coloring agent, based on 100 wt. % of the thermal interface material without the coloring agent.

According to an embodiment of the present disclosure, a dispensable thermal interface material includes at least one polymer; at least one thermally conductive filler; at least one coloring agent; and at least one solvent. The coloring agent is selected from the group consisting of: an iron based inorganic pigment; and an organic pigment. In one more particular embodiment, the iron based inorganic pigment is an iron oxide pigment selected from the group consisting of: α-$Fe_2O_3$; α-$Fe_2O_3.H_2O$; $Fe_3O_4$. In another more particular embodiment, the organic pigment has a formula selected from the group consisting of Formulas (I)-(XVI). In one more particular embodiment of any of the above embodiments, the solvent is an isoparaffinic fluid. In one more particular embodiment of any of the above embodiments, the solvent comprises from 1 wt. % to 20 wt. % based on the total weight of a mixture including the thermal interface material and the solvent. In one more particular embodiment of any of the above embodiments, the dispensable thermal interface material as described above has the viscosity in the range of 10 Pa·s to 100,000 Pa·s.

In one more particular embodiment of any of the above embodiments, the coloring agent is an organic pigment of Formula (I). In one more particular embodiment of any of the above embodiments, the coloring agent is selected from the group consisting of α-$Fe_2O_3$; α-$Fe_2O_3.H_2O$ and $Fe_3O_4$.

According to an embodiment of the present disclosure, an electronic component includes: a heat sink; a substrate; a thermal interface material positioned between the heat sink and the substrate, the thermal interface material including: at least one polymer; at least one thermally conductive filler; and one coloring agent selected from the group consisting of: an iron based inorganic pigment; and an organic pigment. The coloring agent is selected from the group consisting of: an iron based inorganic pigment; and an organic pigment. In one more particular embodiment, the iron based inorganic pigment is an iron oxide pigment selected from the group consisting of: α-$Fe_2O_3$; α-$Fe_2O_3.H_2O$; $Fe_3O_4$. In another more particular embodiment, the organic pigment has a formula selected from the group consisting of Formulas (I)-(XVI).

BRIEF DESCRIPTION OF THE DRAWINGS

The above-mentioned and other features and advantages of this disclosure, and the manner of attaining them, will become more apparent and the invention itself will be better understood by reference to the following description of embodiments of the invention taken in conjunction with the accompanying drawings, wherein:

FIG. 14 is related to the Examples and shows the thermal interface material of Example 11 screen printed on a substrate.

Corresponding reference characters indicate corresponding parts throughout the several views. The exemplifications set out herein illustrate exemplary embodiments of the invention and such exemplifications are not to be construed as limiting the scope of the invention in any manner.

DETAILED DESCRIPTION

A. Thermal Interface Material

Figure 1:
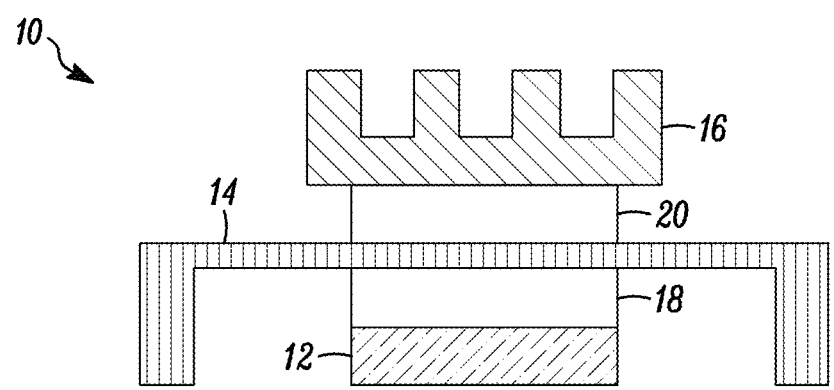
FIG. 1 schematically illustrates a typical electronics package structure.

The present invention relates to thermal interface materials (TIMs) useful in transferring heat away from electronic components. In one exemplary embodiment, the TIM comprises a polymer matrix, at least one thermally conductive filler, and at least one coloring agent selected from the group consisting of: $\alpha\text{-Fe}_2O_3$; $\alpha\text{-Fe}_2O_3 \cdot H_2O$; $Fe_3O_4$; and an organic pigment selected from the group consisting of Formulas (I)-(XVI). In another exemplary embodiment, the TIM comprises a polymer matrix, at least one thermally conductive filler, and at least one coloring agent selected from the group consisting of: α-Fe$_2$O$_3$; α-Fe$_2$O$_3$.H$_2$O; Fe$_3$O$_4$; and an organic pigment of Formula (I).

In some embodiments, the TIM optionally includes one or more of the following components: coupling agent, antioxidant, phase change material, ion scavenger and other additives.

As illustrated in the Examples presented below, the inclusion of the particular pigments in the thermal interface material provided a distinguishable color to the thermal interface material without significantly affecting thermal properties.

1. Polymer

The TIM includes a polymer, such as an elastomer. In some embodiments, the polymer comprises a silicone rubber, a siloxane rubber, a siloxane copolymer, or other suitable silicone-containing rubber. In some embodiments, the polymer comprises one or more hydrocarbon rubber compounds, including saturated or unsaturated hydrocarbon rubber compounds.

Exemplary saturated rubbers include ethylene-propylene rubbers (EPR, EPDM), polyethylene/butylene, polyethylene-butylene-styrene, polyethylene-propylene-styrene, hydrogenated polyalkyldiene "mono-ols" (such as hydrogenated polybutadiene mono-ol, hydrogenated polypropadiene mono-ol, hydrogenated polypentadiene mono-ol), hydrogenated polyalkyldiene "diols" (such as hydrogenated polybutadiene diol, hydrogenated polypropadiene diol, hydrogenated polypentadiene diol) and hydrogenated polyisoprene, polyolefin elastomer, and blends thereof. In some embodiments, the polymer is a hydrogenated polybutadiene mono-ol.

Exemplary unsaturated rubbers include polybutadiene, polyisoprene, polystyrene-butadiene and blends thereof, or blends of saturated and unsaturated rubber compounds.

The TIM comprises the one or more polymers in an amount as little as 1 wt. %, 2 wt. %, 5 wt. %, 6 wt. %, 7 wt. %, 8 wt. %, as great as 10 wt. %, 20 wt. %, 25 wt. %, 50 wt. %, or greater, or within any range defined between any two of the foregoing values, such as 1 wt. % to 50 wt. %, 1 wt. % to 10 wt. %, or 1 wt. % to 5 wt. %, for example based on the total weight of the TIM.

2. Thermally Conductive Filler

The TIM includes one or more thermally conductive fillers. Exemplary thermally conductive fillers include metals, alloys, nonmetals, metal oxides, metal nitrides, and ceramics, and combinations thereof. Exemplary metals include, but are not limited to, aluminum, copper, silver, zinc, nickel, tin, indium, lead, silver coated metals such as silver coated copper or silver coated aluminum, metal coated carbon fibers, and nickel coated fibers. Exemplary nonmetals include, but are not limited to, carbon, graphite, carbon nanotubes, carbon fibers, graphene, powdered diamond, glass, silica, silicon nitride, and boron coated particles. Exemplary metal oxides, metal nitrides and ceramics include but are not limited to alumina, aluminum nitride, boron nitride, zinc oxide, and tin oxide.

In some exemplary embodiments, the thermally conductive filler is provided as a plurality of particles. Average particle diameter (D50) is commonly used to measure particle size. Illustrative particles have average particle diameters as little as 10 nm, 20 nm, 50 nm, 0.1 microns, 0.2 microns, 0.5 microns, 1 micron, 2 microns, 3 microns, as great as 5 microns, 8 microns, 10 microns, 12 microns, 15 microns 20 microns, 25 microns, 50 microns, 100 microns, or within any range defined between any two of the foregoing values, such as 10 nm to 100 micron, 0.1 microns to 20 microns, or 0.5 microns to 10 microns, for example.

In one embodiment, the thermally conductive fillers have different particle sizes to increase the packing effect between filler particles. In some embodiments, the first and second thermally conductive fillers are two different types of thermally conductive fillers having different particle sizes. In some embodiments, the first and second thermally conductive fillers are the same thermally conductive filler, but have different particle sizes.

In one exemplary embodiment, the TIM comprise the one or more thermally conductive fillers in a total amount as little as 50 wt. %, 60 wt. %, 75 wt. %, as great as 80 wt. %, 85 wt. %, 90 wt. %, 95 wt. %, 97 wt. %, or within any range defined between any two of the foregoing values, such as 50 wt. % to 97 wt. %, 80 wt. % to 95 wt. %, or 85 wt. % to 95 wt. %, for example, based on the total weight of the TIM.

3. Coloring Agent

The TIM includes a coloring agent, such as organic and inorganic pigments and organic dyes. Exemplary organic pigments include: benzimidazolone, such as the blue shade benzimidazolone pigment Novoperm Carmine HF3C from Clariant International Ltd, Muttenz Switzerland. Exemplary inorganic pigments include carbon black and iron based compounds. Exemplary iron based compounds include iron oxide compounds such as α-Fe$_2$O$_3$, α-Fe$_2$O$_3$.H$_2$O, Fe$_3$O$_4$ and combinations thereof. Exemplary organic dyes include: Benzo[kl]thioxanthene-3,4-dicarboximide,N-octadecyl- (8Cl); Benzothioxanthene-3,4-dicarboxylic acid-N-stearylimide.

In some exemplary embodiments, the coloring agent is an inorganic pigment selected from the group consisting of α-Fe$_2$O$_3$; α-Fe$_2$O$_3$.H$_2$O; and Fe$_3$O$_4$.

In some exemplary embodiments, the coloring agent is an organic pigment. In a more particular embodiment, the coloring agent is an organic selected from the group consisting of Formulas (I)-(XVI).

In a more particular embodiment, the coloring agent is an organic pigment of Formula (I), also known as pigment red 176, and having CAS No. 12225-06-8.

Formula (I)

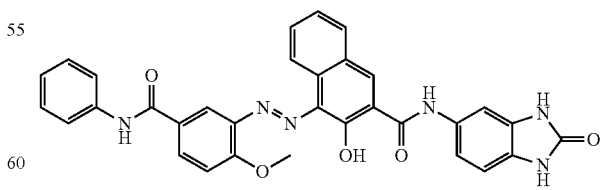

In a more particular embodiment, the coloring agent is an organic pigment of Formula (II), also known as calcium bis[4-[[1-[[(2-methylphenyl)amino]carbonyl]-2-oxopropyl]azo]-3-nitrobenzenesulphonate, and having CAS No. 12286-66-7.

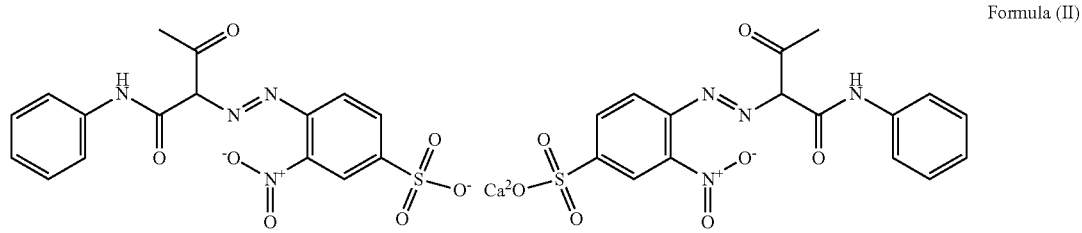

Formula (II)

In a more particular embodiment, the coloring agent is an organic pigment of Formula (III) also known as diethyl 4,4'-[(3,3'-dichloro[1,1'-biphenyl]-4,4'-diyl)bis(azo)]bis[4,5-dihydro-5-oxo-1-phenyl-1h-pyrazole-3-carboxylate], and having CAS No. 6358-87-8.

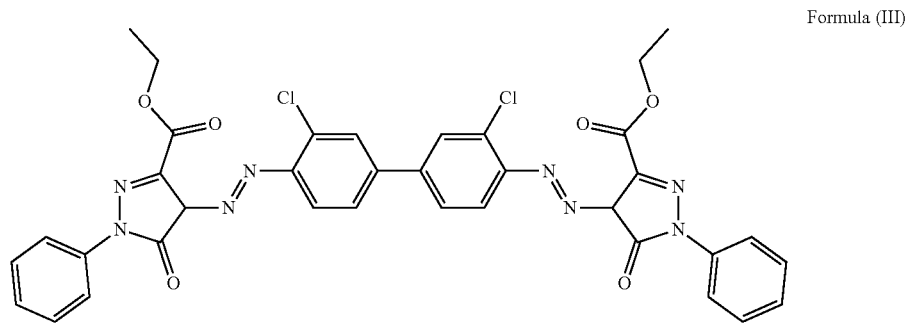 [SMILES: CCOC(=O)C1=NN(c2ccccc2)C(=O)C1/N=N/c1ccc(-c2ccc(/N=N/C3C(=O)N(c4ccccc4)N=C3C(=O)OCC)c(Cl)c2)cc1Cl]

Formula (III)

In a more particular embodiment, the coloring agent is an organic pigment of Formula (IV) also known as 2,2'-[(3,3'-Dichloro[1,1'-biphenyl]-4,4'-diyl)bis(azo)]bis[N-(2,4-dimethylphenyl)-3-oxo-butanamide, and having CAS No. 5102-83-0.

In a more particular embodiment, the coloring agent is an organic pigment of Formula (V) also known as (29H,31H-phthalocyaninato(2-)-N29,N30,N31,N32)copper, and having CAS No. 147-14-8.

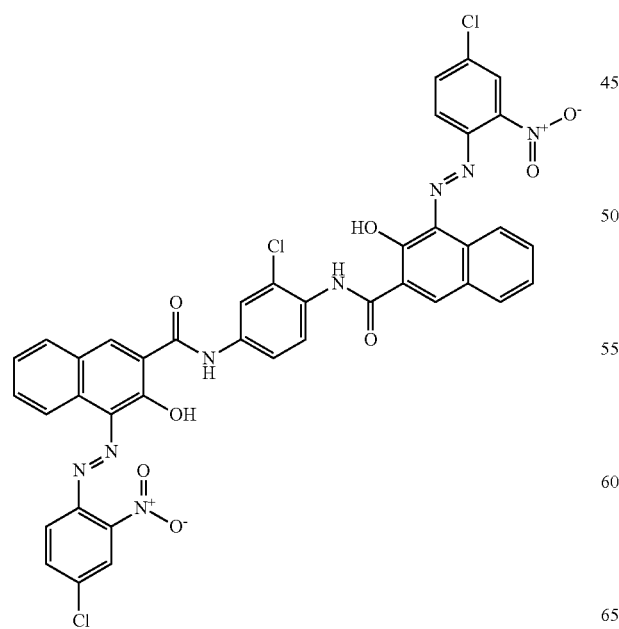

Formula (IV)

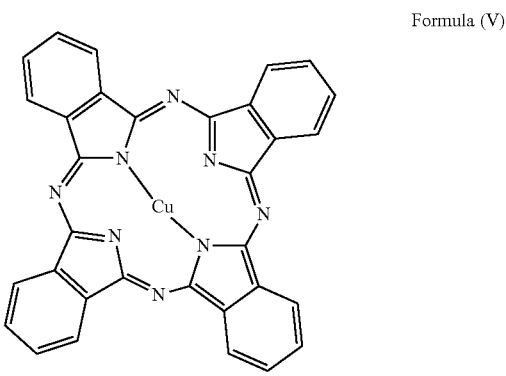

Formula (V)

In a more particular embodiment, the coloring agent is an organic pigment of Formula (VI) also known as brilliant-greenphthalocyanine, and having CAS No. 1328-53-6.

Formula (VI)

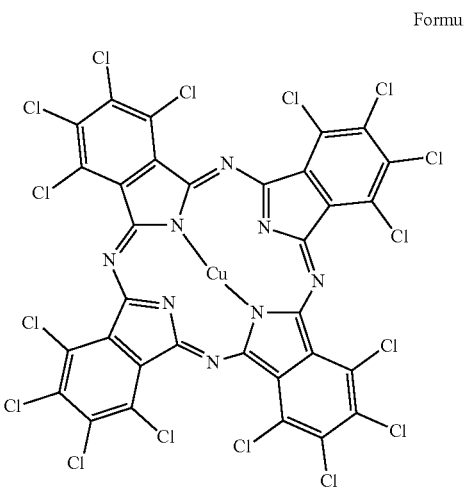

In a more particular embodiment, the coloring agent is an organic pigment of Formula (VII) also known as 9,19-dichloro-5,15-diethyl-5,15-dihydro-diindolo[2,3-c:2',3'-n]triphenodioxazine, and having CAS No. 6358-30-1.

Formula (VII)

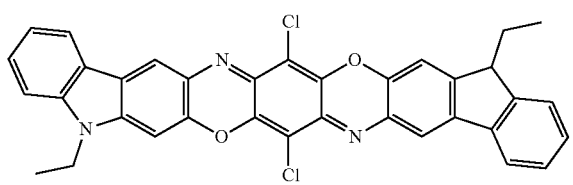

In a more particular embodiment, the coloring agent is an organic pigment of Formula (VIII) also known as 5,12-DIHYDROQUIN[2,3-B]ACRIDINE-7,14-DIONE; 5,12-dihydroquino[2,3-b]acridine-7,14-dione, and having CAS No. 1047-16-1.

Formula (VIII)

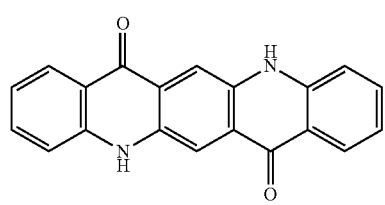

In a more particular embodiment, the coloring agent is an organic pigment of Formula (IX) also known as 2,9-bis(3,5-dimethylphenyl)anthra[2,1,9-def:6,5,10-d'e'f']diisoquinoline-1,3,8,10(2h,9h)-tetrone, and having CAS No. 4948-15-6.

Formula (IX)

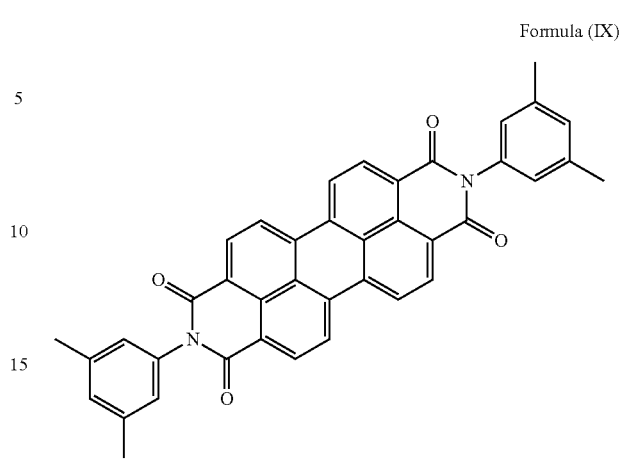

In a more particular embodiment, the coloring agent is an organic pigment of Formula (X) also known as 4,4'-diamino-[1,1'-bianthracene]-9,9',10,10'-tetraone or pigment red 177, and having CAS No. 4051-63-2.

Formula (X)

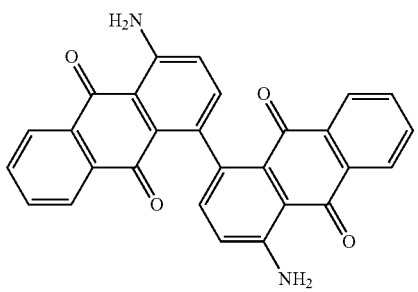

In a more particular embodiment, the coloring agent is an organic pigment of Formula (XI) also known as 3,3'-[(2-methyl-1,3-phenylene)diimino]bis[4,5,6,7-tetrachloro-1H-isoindol-1-one], and having CAS No. 5045-40-9.

Formula (XI)

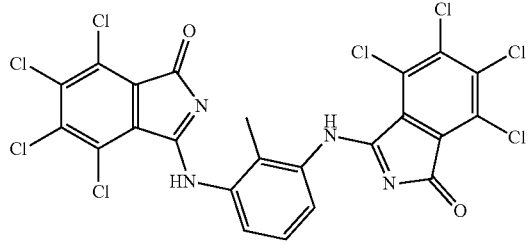

In a more particular embodiment, the coloring agent is an organic pigment of Formula (XII) also known as calcium bis[4-[[1-[[(2-chlorophenyl)amino]carbonyl]-2-oxopropyl]azo]-3-nitrobenzenesulphonate], and having CAS No. 71832-85-4.

Formula (XII)

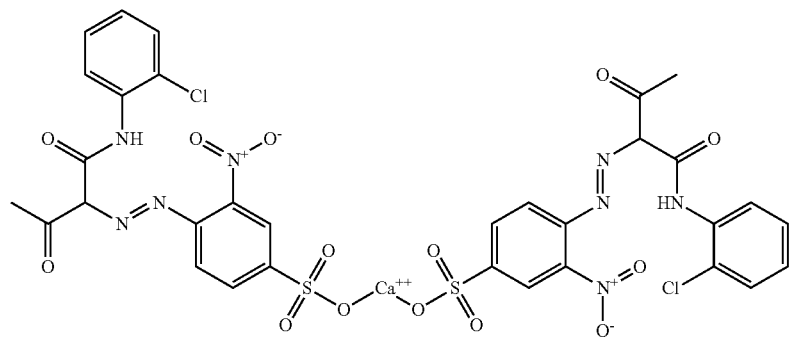

In a more particular embodiment, the coloring agent is an organic pigment of Formula (XIII) also known as 3,4,5,6-Tetrachloro-N-[2-(4,5,6,7-tetrachloro-2,3-dihydro-1,3-dioxo-1H-inden-2-yl)-8-quinolyl]phthalimide, and having CAS No. 30125-47-4.

Formula (XIII)

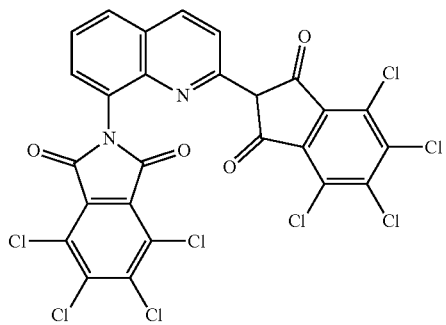

In a more particular embodiment, the coloring agent is an organic pigment of Formula (XIV) also known as [1,3-dihydro-5,6-bis[[(2-hydroxy-1-naphthyl)methylene]amino]-2H-benzimidazol-2-onato(2-)-N5,N6,O5,O6]nickel, and having CAS No. 42844-93-9.

Formula (XIV)

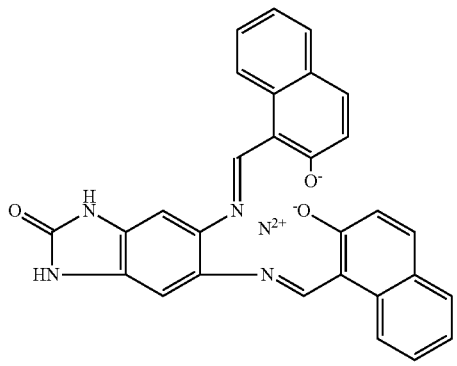

In a more particular embodiment, the coloring agent is an organic pigment of Formula (XV) also known as Pigment Red 279, and having CAS No. 832743-59-6, wherein each R is independently selected from the group consisting of hydrogen, alkyl, aryl, and halogen. In an even more particular embodiment, each R is independently selected from the group consisting of hydrogen, $C_1$-$C_6$ alkyl, phenyl, and halogen. In another more particular embodiment, each R is chlorine, and even more particularly, each R is 7-chloro.

Formula (XV)

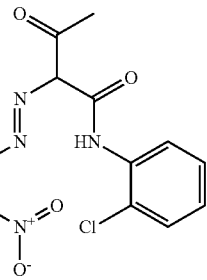

In a more particular embodiment, the coloring agent is an organic pigment of Formula (XVI) also known as Pyrimido [5,4-g]pteridine-2,4,6,8-tetramine, 4-methylbenzenesulfonate, base-hydrolysed, and having CAS No. 346709-25-9.

Formula (XVI)

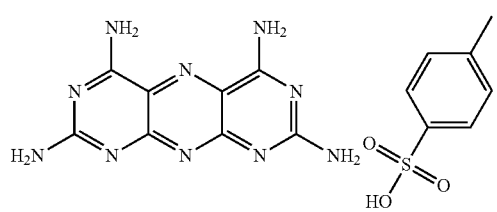

In one more particular embodiment, the coloring agent is $\alpha$-$Fe_2O_3$, such as such as Iron Red available from BAI YAN. In another more particular embodiment, the coloring agent is $\alpha$-$Fe_2O_3$.$H_2O$, such as such as Iron Yellow available from BAI YAN. In still another more particular embodiment, the coloring agent is $Fe_3O_4$, such as such as Iron Blue available from BAI YAN. In yet still another more particular embodiment, the coloring agent is the pigment of Formula (I), having the chemical formula $C_{32}H_{24}N_6O_5$, such as Novoperm Carmine HF3C, available from Clariant International Ltd, Muttenz Switzerland.

In some exemplary embodiments, the TIM comprises the coloring agent in an amount as little as 0.1 wt. %, 0.5 wt. %, 1 wt. %, 1.5 wt. %, as great as 2 wt. %, 5 wt. %, 10 wt. %, 15 wt. %, 20 wt. %, or within any range defined between any two of the foregoing values, such as 0.1 wt. % to 10 wt. %, 0.5 wt. % to 2 wt. %, or 5 wt. % to 20 wt. %, for example, based on 100 wt. % of the thermal interface material without the coloring agent.

4. Coupling Agent

In some exemplary embodiments, the TIM comprises one or more coupling agents. Exemplary coupling agents include organometallic compounds, such as titanate coupling agents or zircontate coupling agents, and organic compounds, such as silane coupling agents. Exemplary coupling agents include titanium IV 2,2 (bis 2-propenolatomethyl)butanolato, tris(dioctyl)pyrophosphato-O; zirconium IV 2,2 (bis 2-propenolatomethyl)butanolato, tris(diisooctyl)pyrophosphato-O; titanium IV 2-propanolato, tris(dioctyl)-pyrophosphato-O) adduct with 1 mole of diisooctyl phosphite; titanium IV bis(dioctyl)pyrophosphato-O, oxoethylenediolato, (Adduct), bis(dioctyl) (hydrogen)phosphite-O; titanium IV bis(dioctyl)pyrophosphato-O, ethylenediolato (adduct), bis(dioctyl)hydrogen phosphite; and zirconium IV 2,2-bis(2-propenolatomethyl) butanolato, cyclo di[2,2-(bis 2-propenolatomethyl) butanolato], pyrophosphato-O,O.

In some exemplary embodiments, the TIM comprises the one or more coupling agents in an amount as little as 0.1 wt. %, 0.5 wt. %, 0.67 wt. %, 0.75 wt. %, as great as 1 wt. %, 1.5 wt. %, 2 wt. %, 5 wt. %, 10 wt. %, or within any range defined between any two of the foregoing values, such as 0.1 wt. % to 10 wt. %, 0.1 wt. % to 2 wt. %, or 0.5 wt. % to 1 wt. %, for example, based on the total weight of the TIM.

5. Antioxidant

In some exemplary embodiments, the TIM comprises one or more antioxidants. Exemplary antioxidants include phenol type, amine type antioxidants, or any other suitable type of antioxidant, or a combination thereof. The phenol or amine type antioxidant may also be a sterically hindered phenol or amine type antioxidant. Exemplary phenol type antioxidants include octadecyl 3-(3,5-di-(tert)-butyl-4-hydroxyphenyl) propionate. Exemplary amine type antioxidants include 2,6-di-tert-butyl-4-(4,6-bis(octylthio)-1,3,5-triazin-2-ylamino) phenol. Exemplary sterically hindered antioxidants include sterically hindered sulfur containing phenolic antioxidants. Exemplary antioxidants include the Irganox® antioxidants available from BASF.

Figure 2A:
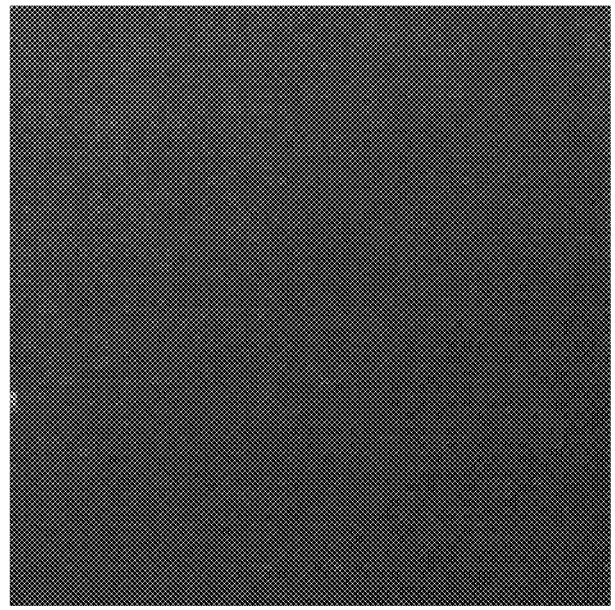
FIG. 2A is related to the Examples and shows the thermal interface material of Comparative Example 1 screen printed at 0.5 mm on paper.
Figure 2B:
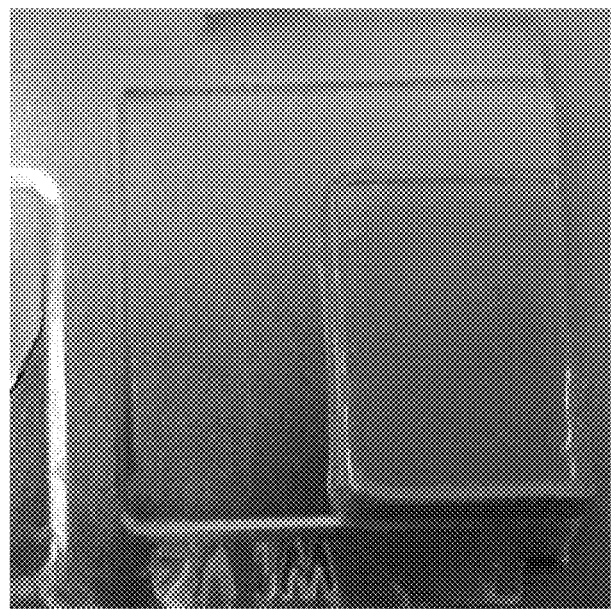
FIG. 2B is related to the Examples and shows the thermal interface material of Comparative Example 1 screen printed at 0.5 mm on a substrate.
Figure 3A:
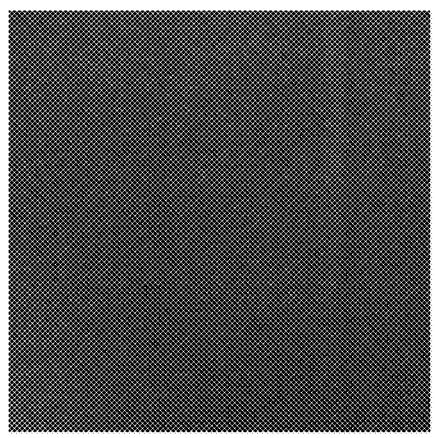
FIG. 3A is related to the Examples and shows the thermal interface material of Example 1 screen printed at 0.5 mm on paper.
Figure 3B:
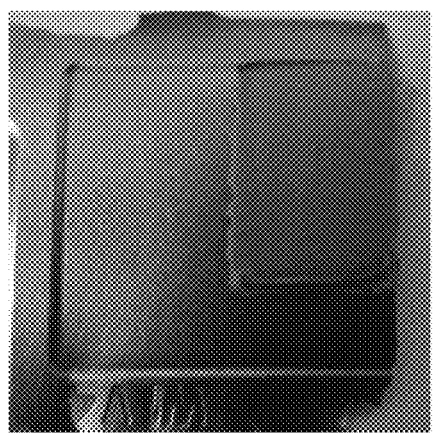
FIG. 3B is related to the Examples and shows the thermal interface material of Example 1 screen printed at 0.5 mm on a substrate.
Figure 3C:
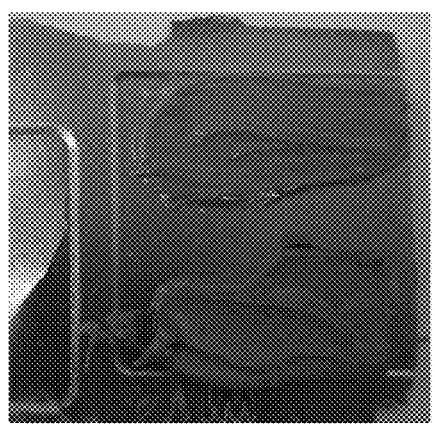
FIG. 3C is related to the Examples and shows a comparison of the thermal interface material of Comparative Example 1 with Example 1 manually applied to a substrate.
Figure 4A:
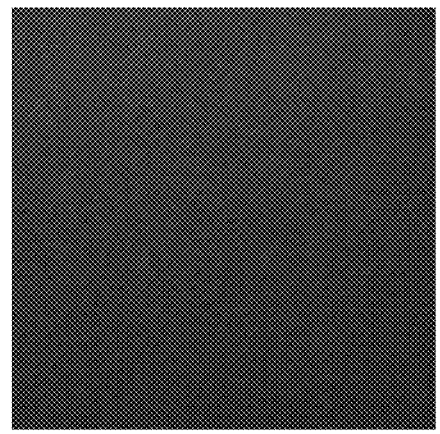
FIG. 4A is related to the Examples and shows the thermal interface material of Example 2 screen printed at 0.5 mm on paper.
Figure 4B:
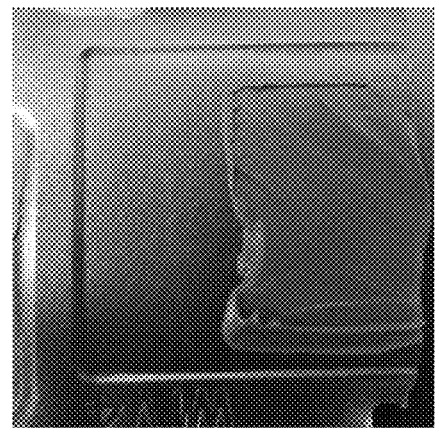
FIG. 4B is related to the Examples and shows the thermal interface material of Example 2 screen printed at 0.5 mm on a substrate.
Figure 4C:
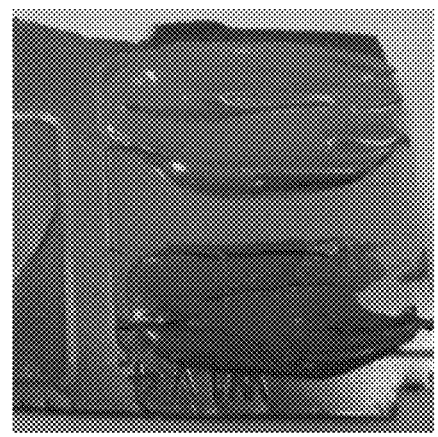
FIG. 4C is related to the Examples and shows a comparison of the thermal interface material of Comparative Example 1 with Example 2 manually applied to a substrate.
Figure 5A:
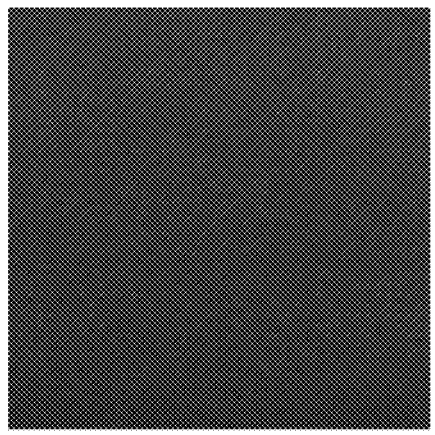
FIG. 5A is related to the Examples and shows the thermal interface material of Example 3 screen printed at 0.5 mm on paper.
Figure 5B:
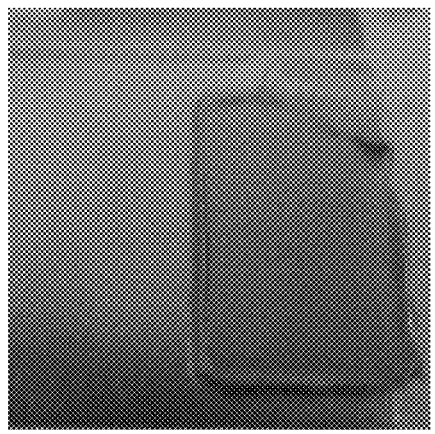
FIG. 5B is related to the Examples and shows the thermal interface material of Example 3 screen printed at 0.5 mm on a substrate.
Figure 5C:
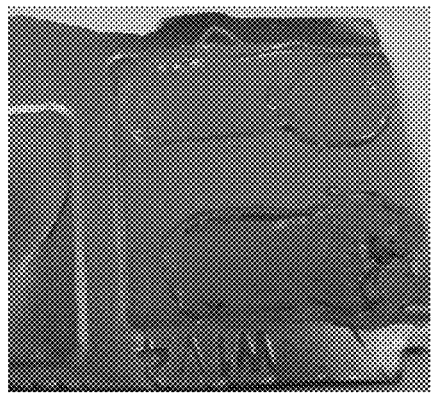
FIG. 5C is related to the Examples and shows a comparison of the thermal interface material of Comparative Example 1 with Example 3 manually applied to a substrate.
Figure 6A:
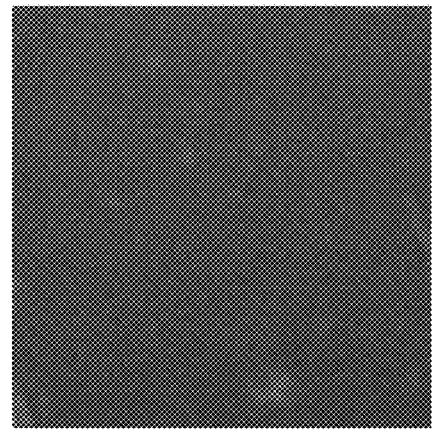
FIG. 6A is related to the Examples and shows the thermal interface material of Example 4 screen printed at 0.5 mm on paper.
Figure 6B:
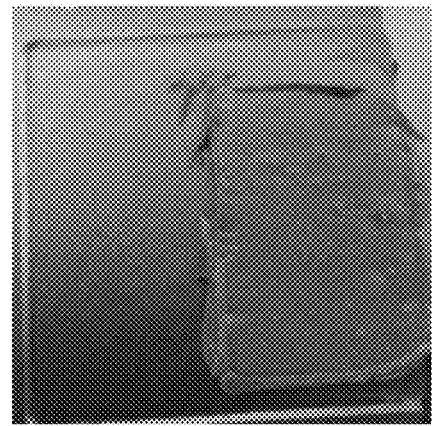
FIG. 6B is related to the Examples and shows the thermal interface material of Example 4 screen printed at 0.5 mm on a substrate.
Figure 6C:
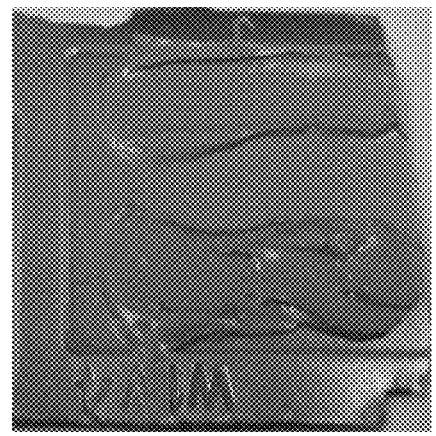
FIG. 6C is related to the Examples and shows a comparison of the thermal interface material of Comparative Example 1 with Example 4 manually applied to a substrate.
Figure 7A:
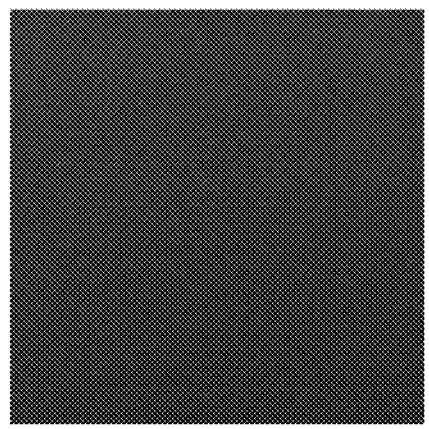
FIG. 7A is related to the Examples and shows the thermal interface material of Example 5 screen printed at 0.5 mm on paper.
Figure 7B:
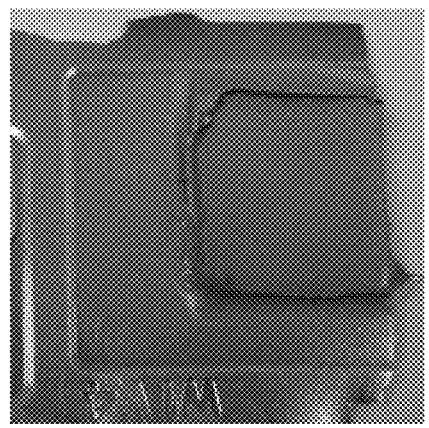
FIG. 7B is related to the Examples and shows the thermal interface material of Example 5 screen printed at 0.5 mm on a substrate.
Figure 7C:
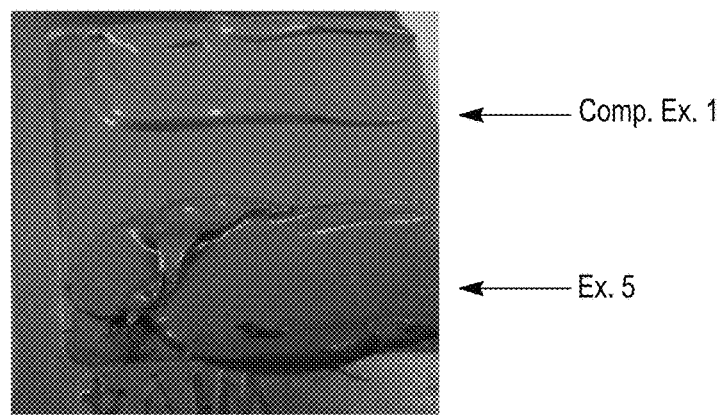
FIG. 7C is related to the Examples and shows a comparison of the thermal interface material of Comparative Example 1 with Example 5 manually applied to a substrate.
Figure 8A:
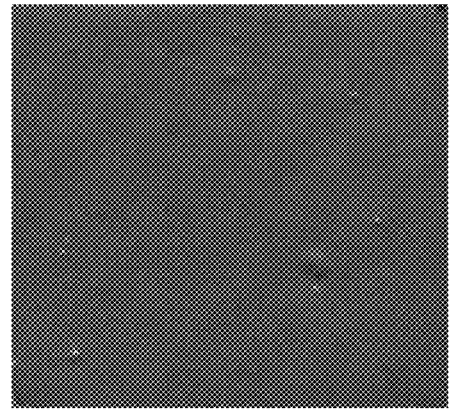
FIG. 8A is related to the Examples and shows the thermal interface material of Example 6 screen printed at 0.5 mm on paper.
Figure 8B:
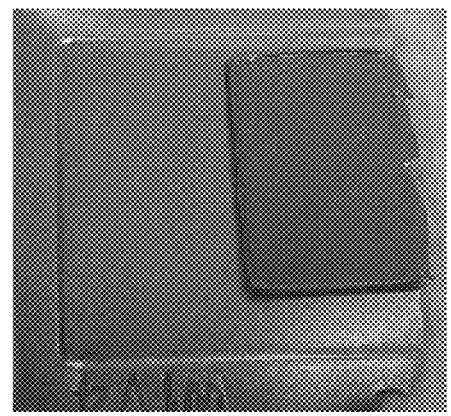
FIG. 8B is related to the Examples and shows the thermal interface material of Example 6 screen printed at 0.5 mm on a substrate.
Figure 8C:
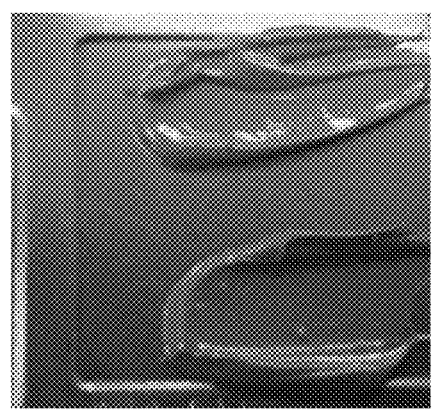
FIG. 8C is related to the Examples and shows a comparison of the thermal interface material of Comparative Example 1 with Example 6 manually applied to a substrate.
Figure 9A:
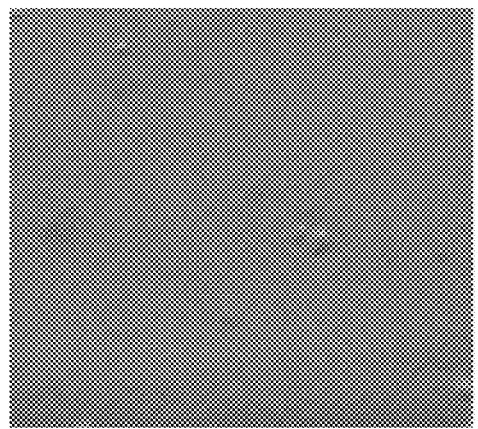
FIG. 9A is related to the Examples and shows the thermal interface material of Example 7 screen printed at 0.5 mm on paper.
Figure 9B:
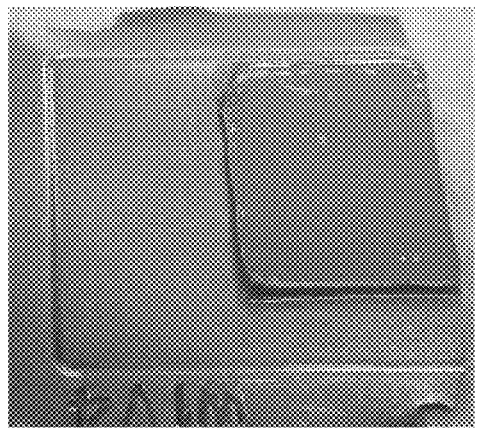
FIG. 9B is related to the Examples and shows the thermal interface material of Example 7 screen printed at 0.5 mm on a substrate.
Figure 9C:
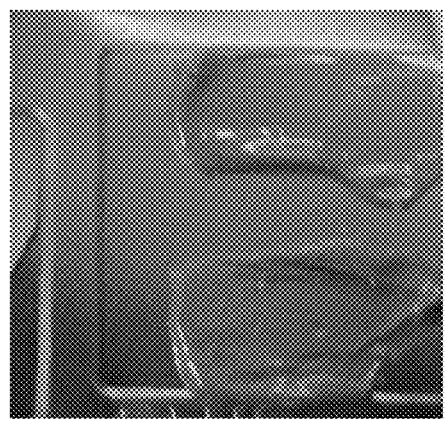
FIG. 9C is related to the Examples and shows a comparison of the thermal interface material of Comparative Example 1 with Example 7 manually applied to a substrate.
Figure 10A:
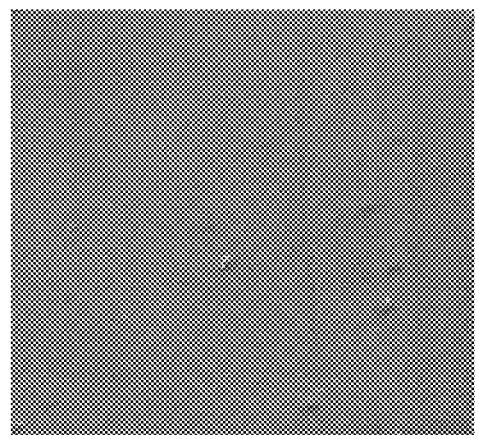
FIG. 10A is related to the Examples and shows the thermal interface material of Example 8 screen printed at 0.5 mm on paper.
Figure 10B:
FIG. 10B is related to the Examples and shows the thermal interface material of Example 8 screen printed at 0.5 mm on a substrate.
Figure 10C:
FIG. 10C is related to the Examples and shows a comparison of the thermal interface material of Comparative Example 1 with Example 8 manually applied to a substrate.
Figure 11A:
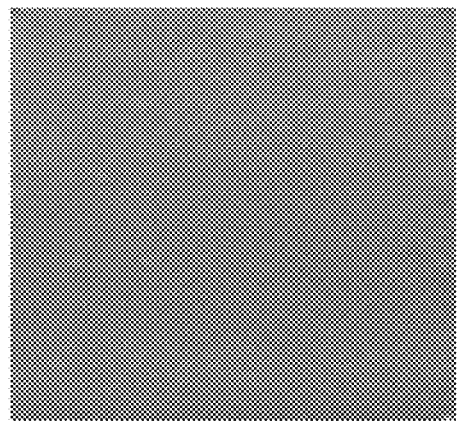
FIG. 11A is related to the Examples and shows the thermal interface material of Example 9 screen printed at 0.5 mm on paper.
Figure 11B:
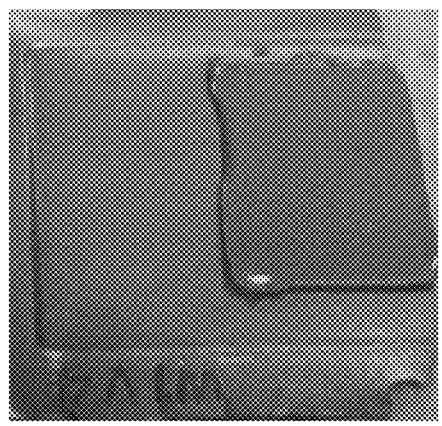
FIG. 11B is related to the Examples and shows the thermal interface material of Example 9 screen printed at 0.5 mm on a substrate.
Figure 11C:
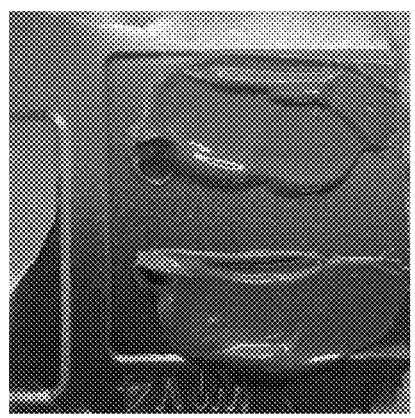
FIG. 11C is related to the Examples and shows a comparison of the thermal interface material of Comparative Example 1 with Example 9 manually applied to a substrate.
Figure 12A:
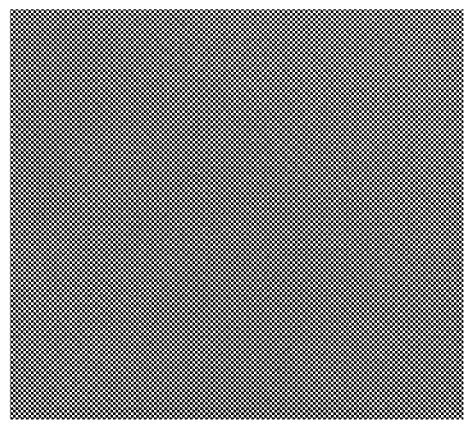
FIG. 12A is related to the Examples and shows the thermal interface material of Example 10 screen printed at 0.5 mm on paper.
Figure 12B:
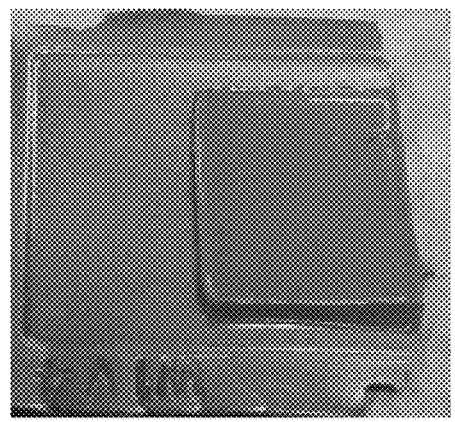
FIG. 12B is related to the Examples and shows the thermal interface material of Example 10 screen printed at 0.5 mm on a substrate.
Figure 12C:
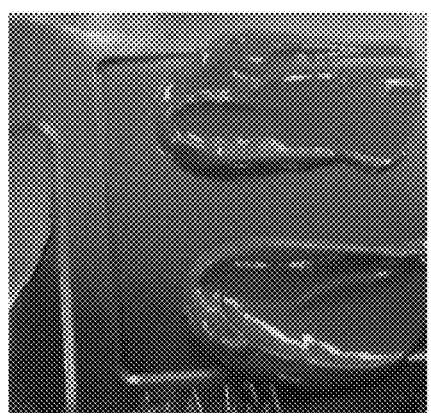
FIG. 12C is related to the Examples and shows a comparison of the thermal interface material of Comparative Example 1 with Example 10 manually applied to a substrate.

Although ion scavengers and antioxidants both reduce oxidative degradation of the TIM, ion scavengers are believed to function by capturing and binding metal ions in a complex such that the metal ions no longer have a net charge and are effectively disabled from participating in the metal-catalyzed reactions of FIG. 2B. In contrast, antioxidants are generally believed to function by transferring electrons to an oxidizing agent, such as the radicals of FIG. 2A.

In some exemplary embodiments, the TIM comprises the one or more antioxidants in an amount as little as 0.05 wt. %, 0.1 wt. %, 0.5 wt. %, 1 wt. % as great as 1.5 wt. %, 2 wt. %, 5 wt. %, 10 wt. %, or within any range defined between any two of the foregoing values, such as 0.1 wt. % to 10 wt. %, 0.1 wt. % to 2 wt. %, or 0.5 wt. % to 1 wt. %, for example, based on the total weight of the TIM.

6. Phase Change Material

In some exemplary embodiments, the TIM comprises one or more phase change materials. A phase change material is a material having a melting point or melting point range at or below the operating temperature of a portion of an electronic device in which the TIM is to be used. An exemplary phase change material is a wax. Other exemplary phase change materials include low melting alloys, such as Wood's metal, Field's metal, or a metal or alloy having a melting point between about 20° C. and 90° C.

In some embodiments, the phase change material has a phase change temperature as low as 20° C., 30° C., 40° C., 45° C. 50° C., as high as 60° C., 70° C., 80° C., 90° C., 100° C., 110° C., or within any range defined between any two of the foregoing values. In some more particular embodiments, the phase change material has a phase change temperature as low as 30° C., 40° C., 45° C. as high as 50° C., 60° C., 70° C., or within any range defined between any two of the foregoing values.

Exemplary waxes include polyethylene (PE) wax, paraffin wax, AC-1702, a polyethylene wax, AC-430, a copolymer of ethylene-vinyl acetate wax, and AC-6702, an oxidized polyethylene wax, each available from Honeywell International Inc., a polyethylene wax blended with polytetrafluoroethylene such as PEW-0602F wax available from Nanjing Tianshi New Material Technologies, TAC wax, available from The International Group, Inc., and RT44HC, available from Hangzhou Ruhr Tech.

The TIM comprises the one or more phase change materials in an amount as little as 0.5 wt. %, 1 wt. %, 2 wt. %, 3 wt. %, 5 wt. %, 10 wt. %, as great as 20 wt. %, 25 wt. %, 50 wt. %, or greater, or within any range defined between any two of the foregoing values, such as 0.5 wt. % to 50 wt. %, 1 wt. % to 10 wt. %, or 1 wt. % to 5 wt. %, for example, based on the total weight of the TIM.

7. Ion Scavenger

In some exemplary embodiments, the TIM comprises one or more ion scavengers. Exemplary ion scavengers include nitrogen containing complexing agents, phosphorous containing complexing agents, and hydroxyl carboxylic acid based complexing agents. In some exemplary embodiments, the ion scavenger is selected from acid amide compounds, such as hydrazide or dihydrazide. In some exemplary embodiments, the ion scavenger is selected from triazole compounds, tetrazole compounds, triazene compounds, oxamide compounds, or malonamide compounds. In some exemplary embodiments, the ion scavenger is selected from decamethylenedicarboxylic acid disalicyloylhydrazide; 3-(N-salicyloyl)amino-1,2,4-triazole; and 2', 3-bis [[3-[3, 5-di-tert-butyl-4-hydroxyphenyl] propionic]]propionyl hydrazide.

In another more particular embodiment, the ion scavenger is a compound according to any of the following compounds or combinations thereof: N-salicylidene-N'salicyloyl hydrazide, oxalyl bis(benzylidenehydrazide), N,N'-bis(salicyloyl)hydrazine, 3-(N-salicyloyl)amino-1,2,4-triazole, 2,2'-oxamido bis[ethyl 3-(3,5-di-tert-butyl-4-hydroxyphenyl)propionate], N,N'-bis(salicylidene) ethylenediamine, Oxanilide, Methylmalonic acid dianilide, N-formyl-N'-salicyloyl hydrazine, Decamethylenedicarboxylic acid disalicyloylhydrazide, and Bis(2,6-di-ter-butyl-4-methylphenyl) pentaerythritol-diphosphite.

The TIM comprises the one or more ion scavengers in an amount as little as 0.1 wt. %, 0.2 wt. %, 0.5 wt. %, 1 wt. % as great as 1.5 wt. %, 2 wt. %, 5 wt. %, 10 wt. %, or within any range defined between any two of the foregoing values, such as 0.1 wt. % to 10 wt. %, 0.1 wt. % to 2 wt. %, or 0.5 wt. % to 1 wt. %, for example, based on the total weight of the TIM.

8. Other Additives

In some exemplary embodiments, the TIM comprises one or more additional additives. Exemplary additives include crosslinkers, such as alkylated melamine formaldehyde resin, and pigments.

In some exemplary embodiments, the TIM comprises the one or more additives in an amount as little as 0.1 wt. %, 0.5 wt. %, 1 wt. % as great as 1.5 wt. %, 2 wt. %, 5 wt. %, 10 wt. %, or within any range defined between any two of the foregoing values, such as 0.1 wt. % to 10 wt. %, 0.1 wt. % to 2 wt. %, or 0.5 wt. % to 1 wt. %, for example, based on the total weight of the TIM.

9. Exemplary Properties of the Thermal Interface Material

In some exemplary embodiments, a thermal interface material including a coloring agent as described above has a color that visually distinguishes TIM 18 (FIG. 1) from substrate 12 (e.g., chip 12).

In some exemplary embodiments, a thermal interface material including a coloring agent as described above has a thermal impedance approximately the same thermal properties, such as thermal conductivity and thermal impedance, as the thermal properties of a similar thermal interface material that does not include the coloring agent.

In some exemplary embodiments, a thermal interface material including a coloring agent as described above has a thermal conductivity at least 1 W/m·K. An exemplary thermal conductivity test method standard is ASTM D5470.

In some exemplary embodiments, a thermal interface material including a coloring agent as described above has a thermal impedance as little as 0.05° C.·cm$^2$/W, 0.1° C.·cm$^2$/W, 0.15° C.·cm$^2$/W, 0.2° C.·cm$^2$/W as high as 0.25° C.·cm$^2$/W, 0.25° C.·cm$^2$/W, 0.3° C.·cm$^2$/W, 0.35° C.·cm$^2$/W, or within any range defined between any two of the foregoing values, such as 0.05° C.·cm$^2$/W to 0.35° C.·cm$^2$/W, 0.15° C.·cm$^2$/W to 0.3° C.·cm$^2$/W, or 0.2° C.·cm$^2$/W to 0.3° C.·cm$^2$/W, for example.

In some exemplary embodiments, a thermal interface material including a coloring agent as described above is combined with a solvent, such as an isoparaffinic fluid, to form a dispensable thermal interface material. In some exemplary embodiments, the dispensable thermal interface includes an amount as little as 1 wt. %, 2 wt. %, 5 wt. %, as great as 10 wt. %, 15 wt. %, 20 wt. % of the solvent, or within any range defined between any two of the foregoing values, such as 1 wt. % to 20 wt. % or 5 wt. % to 10 wt. %, for example, based on 100 wt. % of the thermal interface material without the solvent.

In some exemplary embodiments, the dispensable thermal interface material as described above has the viscosity in the range of 10 Pa·s to 100,000 Pa·s, or more particularly in the range of 100 Pa·s to 10,000 Pa·s at room temperature. An exemplary viscosity test method standard is DIN 53018. In one particular embodiment, the viscosity is tested by Brookfield Rheometer with shear rate 2 s$^{-1}$. In some exemplary embodiments, the dispensable thermal interface material as described above has the dispense rate in the range of 1 g/min to 1000 g/min, or more particularly in the range of 10 g/min to 100 g/min. In one particular embodiment, the dispense rate is tested under 0.6 MPa pressure with a 10 ml syringe having a 0.1 inch diameter dispense header opening.

B. Methods of Forming a Thermal Interface Material

In some exemplary embodiments, the TIM is prepared by combining the individual components in a heated mixer and blending the composition together.

In some exemplary embodiments, the TIM is then baked at a temperature as low as 25° C., 50° C., 75° C., 80° C., as high as 100° C., 125° C., 150° C., 170° C., or within any range defined between any two of the foregoing values. In some exemplary embodiments, the TIM is baked for as little as 0.5 minutes, 1 minute, 30 minutes, 1 hour, 2 hours, as long as 8 hours, 12 hours, 24 hours, 36, hours, 48 hours, or within any range defined between any two of the foregoing values. An exemplary baking condition is 80° C. for 30 minutes.

C. Applications Utilizing the Thermal Interface Material

Referring again to FIG. 1, in some exemplary embodiments, the thermal interface material including a pigment or dye is positioned as a TIM 1 between an electronic component 12 and a heat spreader 14, as indicated by TIM 18. In some exemplary embodiments, the thermal interface material including a pigment or dye is positioned as a TIM 2 between an a heat spreader 14 and a heat sink 16, as indicated by TIM 20. In some exemplary embodiments, the thermal interface material including a pigment or dye is positioned as a TIM 1.5 (not shown) between an electronic component 12 and a heat sink 16.

EXAMPLES

Thermal interface materials were prepared according to the formulations provided in Table 1.

TABLE 1

Formulations (wt. %) for Comparative Examples 1 and 2

|  | Comp. Ex. 1 | Comp. Ex. 2 |
| --- | --- | --- |
| Elastomer | 8.69 | 6.22 |
| First wax | 2.48 | 1.78 |
| Second wax | 0.62 | — |
| Antioxidant | 0.2 | 0.5 |
| Coupling agent | 1.5 | 0.67 |
| Thermally conductive filler | 85.91 | 90.83 |
| Crosslinker | 0.6 | — |

The elastomer used was Kraton elastomer (a hydroxyl-terminated ethylene butylene copolymer, specialty mono-op. The first wax was a microcrystalline wax with a melting point of about 45° C. The second wax was an amorphous, low density polyethylene homopolymer. The coupling agent was a titanium-based coupling agent. The thermally conductive filler was aluminum particles having a particle size greater than 1 micron. The crosslinker was a Cymel alkylated melamine formaldehyde resin.

To prepare each Comparative Examples, the elastomer waxes, and antioxidant were combined and blended in a heated mixer until the combination had melted and had a substantially homogeneous appearance. The coupling agent, thermally conductive filler, and crosslinkers were then added, with the mixture being blended after each addition until a substantially homogeneous appearance was achieved. The final formulation was added to an isopar-HP solvent, which constituted 9 wt % of the total mixture weight. The final combination had a homogeneous appearance.

Figure 13A:
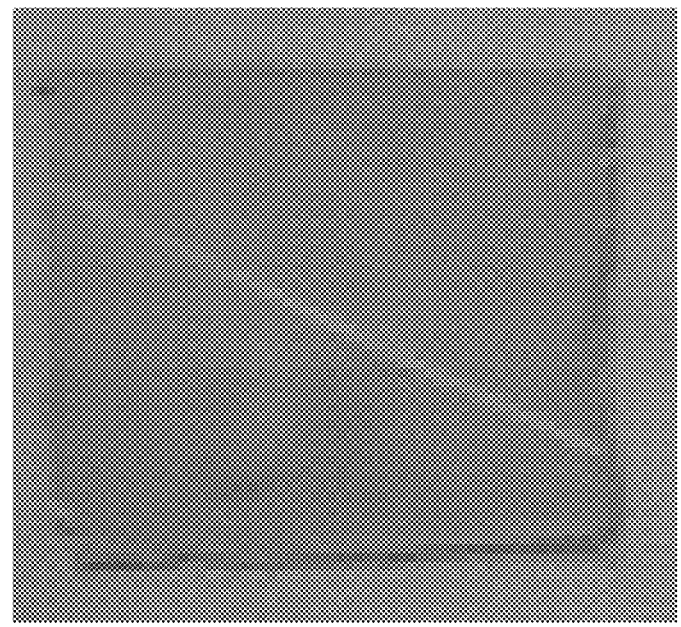
FIG. 13 is related to the Examples and shows the thermal interface material of Comparative Example 2 screen printed on a substrate.
Figure 13B:
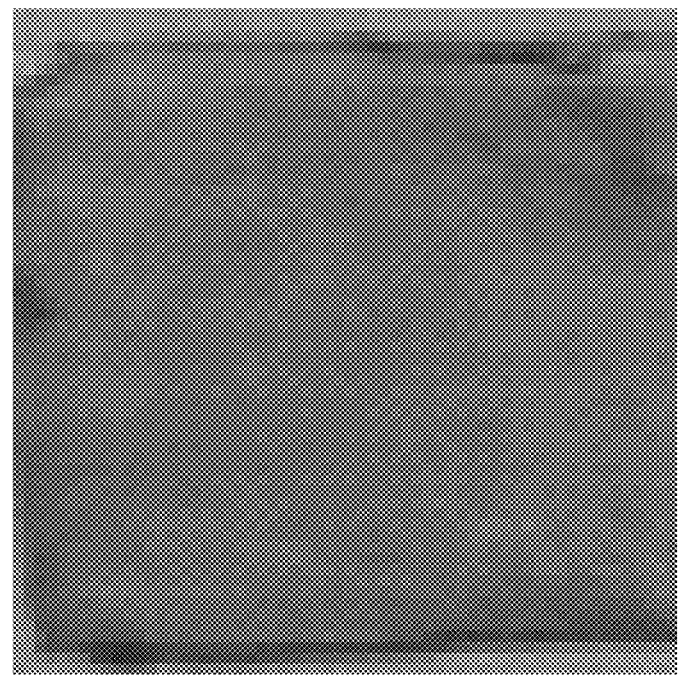

FIGS. 2A and 2B show the thermal interface material of Comparative Example 1 screen printed at 0.5 mm on paper and a magnesium aluminum alloy substrate. FIG. 13 shows the thermal interface material of Comparative Example 2 screen printed on a substrate.

Examples 1-10 were prepared by adding a coloring agent according to Table 2 to 100 grams of Comparative Example 1. Each mixture was then stirred with a speed mixer under 3000 revolutions per minute (rpm) for 5 minutes. Example 11 was prepared by adding a coloring agent to 100 grams of Comparative Example 2. The mixture was then stirred with a speed mixer under 34 revolutions per minute (rpm) for 60 minutes. The resulting paste was then screened onto a substrate. Examples 1-10 were visually compared to Comparative Example 1 and Example 11 was visually compared to Comparative Example 2 for any color differentiation. The results are shown in FIGS. 3A-12C and 14, and summarized in Table 2 below.

TABLE 2

Formulations for Examples 1-11 and Visual comparison of Examples 1-10 with Comparative Example 1 and Example 11 with Comparative Example 2

| | Additive | Additive (g) | Comp. Ex. 1 (g) | Comp. Ex. 2 (g) | Color Difference |
|---|---|---|---|---|---|
| Ex. 1 | Carbon black | 1 | 100 | — | No |
| Ex. 2 | Iron red | 10 | 100 | — | Yes |
| Ex. 3 | Iron yellow | 10 | 100 | — | Yes |
| Ex. 4 | Iron green | 10 | 100 | — | No |
| Ex. 5 | Iron blue | 10 | 100 | — | Yes |
| Ex. 6 | Red pigment | 1 | 100 | — | Yes |
| Ex. 7 | Red dye | 1 | 100 | — | No |
| Ex. 8 | Yellow dye | 1 | 100 | — | No |
| Ex. 9 | Blue dye | 1 | 100 | — | No |
| Ex. 10 | Purple dye | 1 | 100 | — | No |
| Ex. 11 | Carbon black | 2 | — | 100 | No |

In Example 1, the added coloring agent was carbon black supplied by Guoyao Group Chemical Reagent Co., Ltd. having a particle size such that 95 wt. % passes through a 35 μm screen. As shown in Table 2 and FIGS. 3A-3C, the addition of the carbon black did not result in a significantly detectable difference in color between Comparative Example 1 and Example 1.

In Example 2, the added coloring agent was α-$Fe_2O_3$ supplied by Shanghai Baiyan Industrial Co., Ltd. As shown in Table 2 and FIGS. 4A-4C, the addition of the inorganic iron red pigment resulted in a visually significant detectable difference in color as perceived by a human eye between Comparative Example 1 and Example 2.

In Example 3, the added coloring agent was α-$Fe_2O_3.H_2O$ supplied by Shanghai Baiyan Industrial Co., Ltd. and Sinopharm Chemical Regent Co., Ltd. As shown in Table 2 and FIGS. 5A-5C, the addition of the inorganic iron yellow pigment resulted in a visually significant detectable difference in color as perceived by a human eye between Comparative Example 1 and Example 3.

In Example 4, the added coloring agent was a mixture of α-$Fe_2O_3.H_2O$ and $Fe_3O_4$, supplied by Shanghai Baiyan Industrial Co., Ltd. As shown in Table 2 and FIGS. 6A-6C, the addition of the inorganic iron green pigment did not result in a visually significant detectable difference in color as perceived by a human eye between Comparative Example 1 and Example 4.

In Example 5, the added coloring agent was $Fe_3O_4$ supplied by Shanghai Baiyan Industrial Co., Ltd. and Sinopharm Chemical Regent Co., Ltd. As shown in Table 2 and FIGS. 7A-7C, the addition of the inorganic iron blue pigment resulted in a visually significant detectable difference in color as perceived by a human eye between Comparative Example 1 and Example 5.

In Example 6, the added coloring agent was Novoperm Carmine H3FC as supplied by Clariant Co. As shown in Table 2 and FIGS. 8A-8C, the addition of the organic red pigment resulted in a visually significant detectable difference in color as perceived by a human eye between Comparative Example 1 and Example 6.

In Comparative 7, the added coloring agent was Solvaperm Red PFS as supplied by Clariant Co. As shown in Table 2 and FIGS. 9A-9C, the addition of the organic red dye did not result in a visually significant detectable difference in color as perceived by a human eye between Comparative Example 1 and Example 7.

In Example 8, the added coloring agent was Fat Yellow 3G as supplied by Clariant Co. As shown in Table 2 and FIGS. 10A-10C, the addition of the organic yellow dye did not result in a visually significant detectable difference in color as perceived by a human eye between Comparative Example 1 and Example 8.

In Example 9, the added coloring agent was Fat Blue B 01 as supplied by Clariant Co. As shown in Table 2 and FIGS. 11A-11C, the addition of the organic blue dye did not result in a visually significant detectable difference in color as perceived by a human eye between Comparative Example 1 and Example 9.

In Example 10, the added coloring agent was Solvaperm Red Violet R as supplied by Clariant Co. As shown in Table 2 and FIGS. 12A-12C, the addition of the organic purple dye did not result in a visually significant detectable difference in color as perceived by a human eye between Comparative Example 1 and Example 10.

In Example 11, the added coloring agent was carbon black supplied by Guoyao Group Chemical Reagent Co., Ltd. having a particle size such that 95 wt. % passes through a 35 μm screen. As shown in Table 2, the addition of the carbon black did not result in a visually significant detectable difference in color as perceived by a human eye between Comparative Example 2, as shown in FIG. 13, and Example 11, as shown in FIG. 14.

As shown in Table 2 above, the formulations including any of the coloring agents α-$Fe_2O_3$; α-$Fe_2O_3.H_2O$; and $Fe_3O_4$, and Formula (I), as used in Examples 2, 3, 5, and 6, exhibited a color differentiation compared to that of Comparative Example 1, which did not include a coloring agent. The formulations prepared with the remaining coloring agents, as in Examples 1, 4, and 7-11 did not exhibit color differentiation compared to the respective comparative examples.

Figure 15:
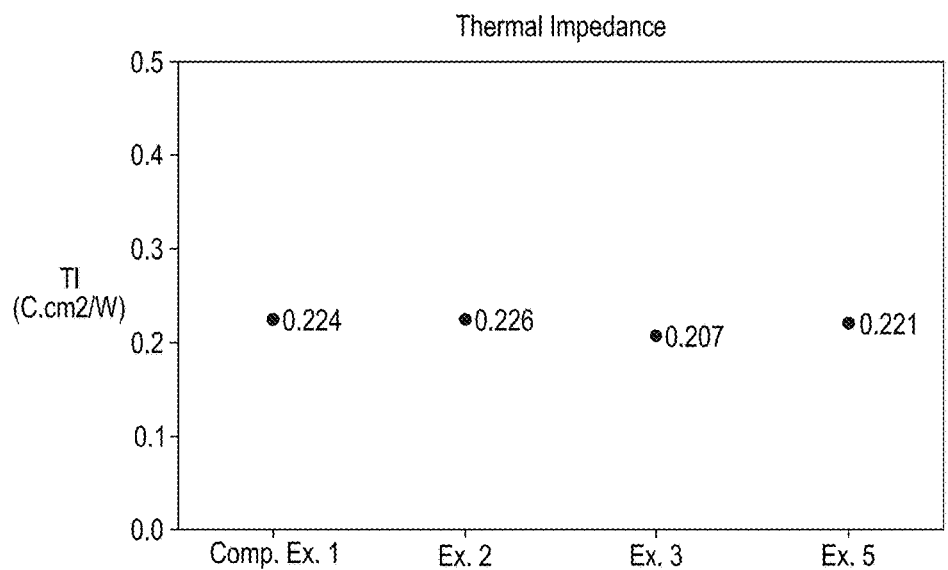
FIG. 15 is related to the Examples and shows the thermal impedance of Comparative Example 1, Example 2, Example 3, and Example 5.
Figure 16:
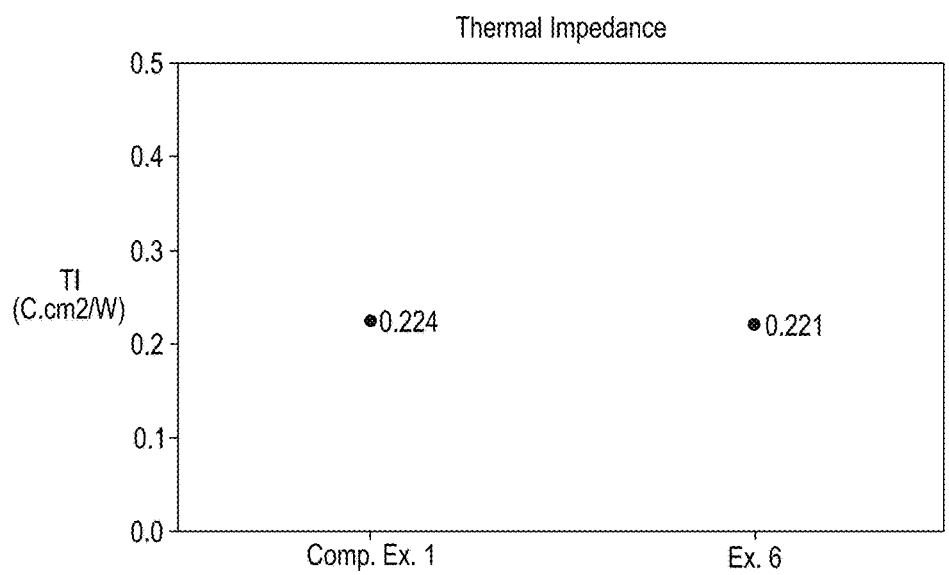
FIG. 16 is related to the Examples and shows the thermal impedance of Comparative Example 1 and Example 6.

Referring next to FIGS. 15 and 16, the thermal impedance of Comparative Example 1, Example 2, Example 3, Example 5, and Example 6 is shown in Table 3 shown below.

TABLE 3

Thermal Impedance Values for Comparative Example 1, Example 2, Example 3, Example 5, and Example 6

| Examples | Thermal Impedance (° C. · cm²/W) |
|---|---|
| Comparative Example 1 | 0.224 |
| Example 2 | 0.226 |
| Example 3 | 0.207 |
| Example 5 | 0.221 |
| Example 6 | 0.221 |

As shown in FIGS. 15 and 16, the addition of the particular coloring agents resulted in a similar thermal impedance compared to Comparative Example 1.

While this invention has been described as having exemplary designs, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:
1. A thermal interface material comprising:
at least one polymer;
at least one thermally conductive filler; and at least one coloring agent in the form of an organic pigment having a formula selected from the group consisting of Formulas (I)-(XVI):
Formula (I)
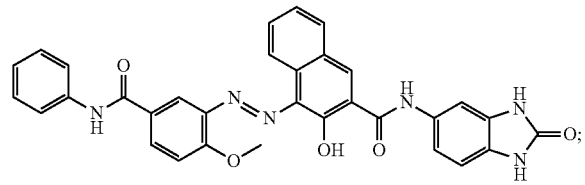
Formula (II)
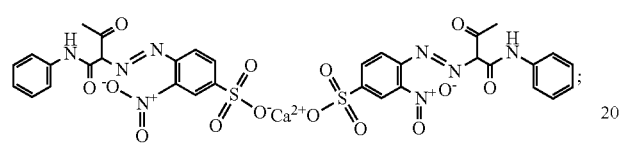
Formula (III)
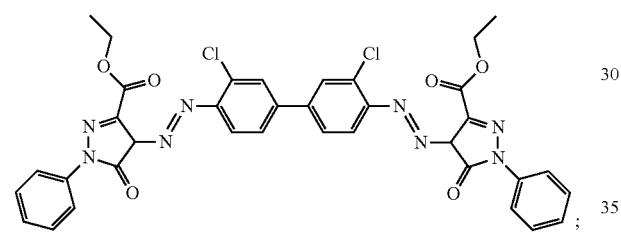
Formula (IV)
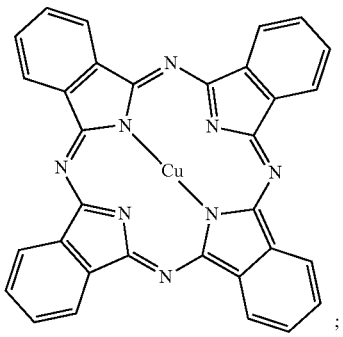
Formula (V)
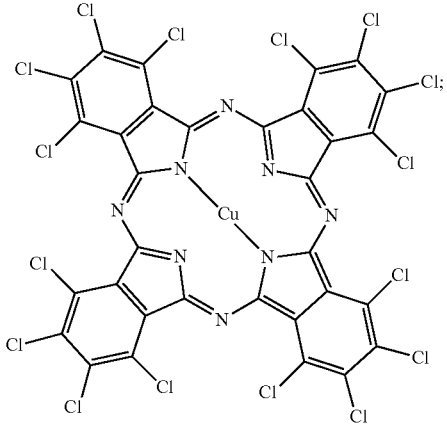
Formula (VI)
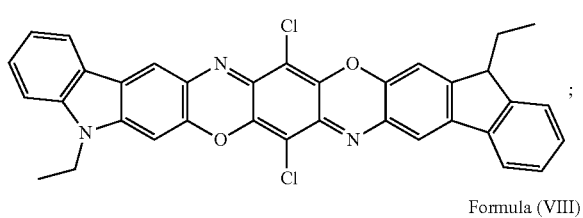
Formula (VII)
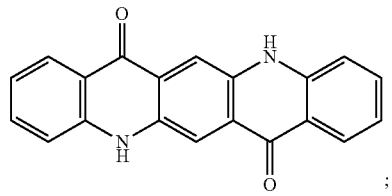
Formula (VIII)
Formula (IX)
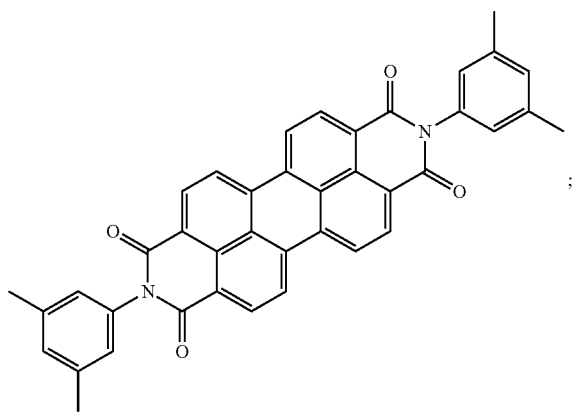

-continued

Formula (X)

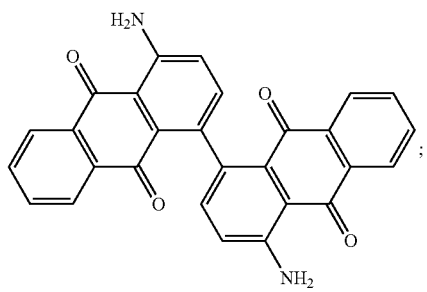

Formula (XI)

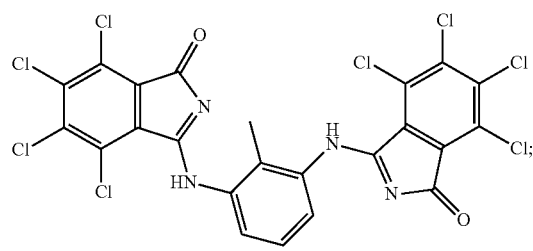

Formula (XII)

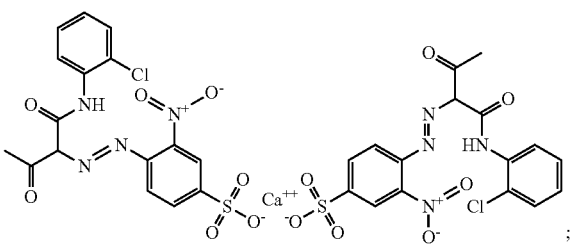

Formula (XIII)

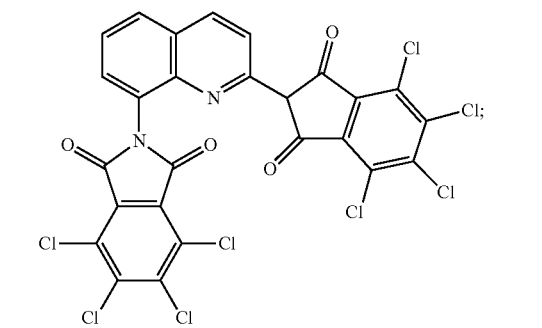

Formula (XIV)

-continued

Formula (XV)

wherein each R is independently selected from H, alkyl, aryl, and halogen; and

Formula (XVI)

2. The thermal interface material of claim 1, wherein the thermal interface material comprises 0.5 wt. % to 2 wt. % of the coloring agent based on 100 wt. % of the thermal interface material without the coloring agent.

3. The thermal interface material of claim 1, wherein the thermal interface material comprises 1 wt. % to 20 wt. % of the coloring agent based on 100 wt. % of the thermal interface material without the coloring agent.

4. The thermal interface material of claim 1, wherein the thermal interface material has a thermal impedance of 0.05° C. cm²/W to 0.3° C. cm²/W.

5. The thermal interface material of claim 1, wherein the thermal interface material comprises:
  5 wt. % to 10 wt. % of the at least one polymer;
  85 wt. % to 95 wt. % of the at least one thermally conductive filler;
  0.1 wt. % and 5 wt. % of a phase change material; and
  0.5 wt. % to 20 wt. % of the coloring agent, based on 100 wt. % of the thermal interface material without the coloring agent.

6. A dispensable thermal interface material comprising:
  at least one polymer;
  at least one thermally conductive filler;
  a coloring agent selected from the group consisting of: α-Fe₂O₃; α-Fe₂O₃.H₂O; Fe₃O₄; and an organic pigment having a formula selected from the group consisting of Formulas (I)-(XVI):

Formula (I)

Formula (II)
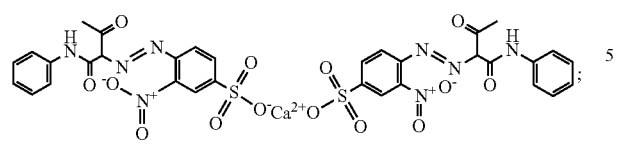
Formula (III)
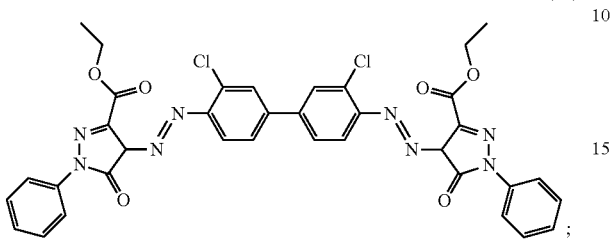
Formula (IV)
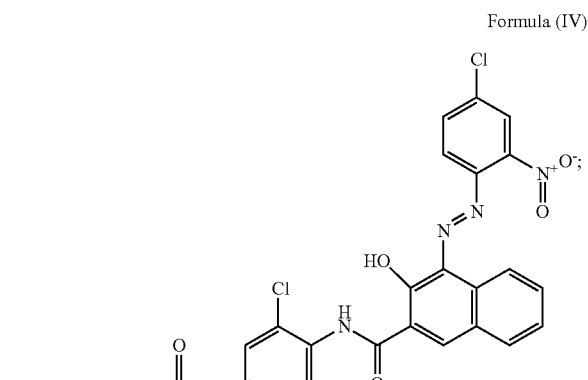
Formula (V)
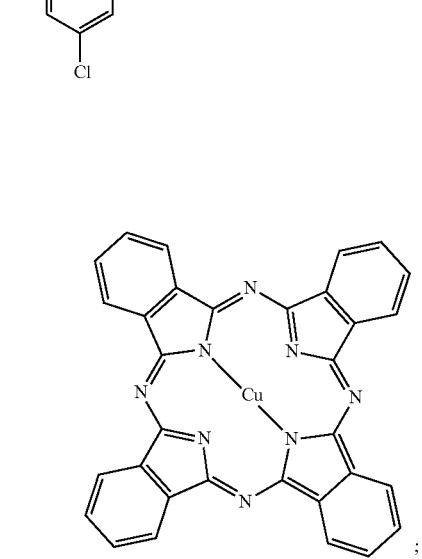
Formula (VI)
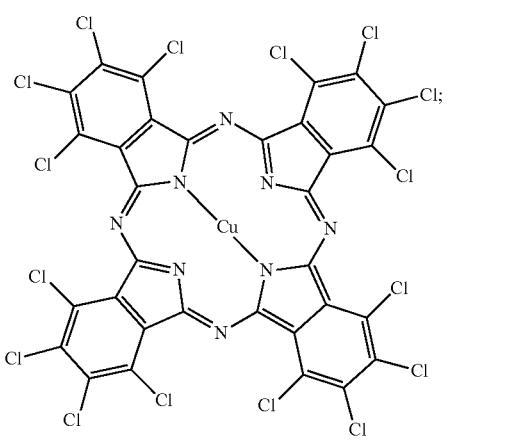
Formula (VII)
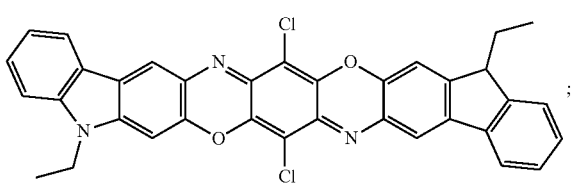
Formula (VIII)
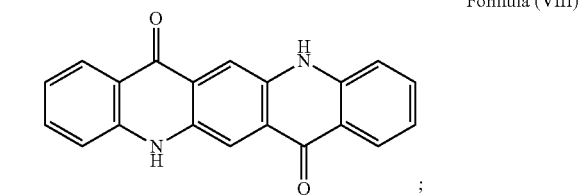
Formula (IX)
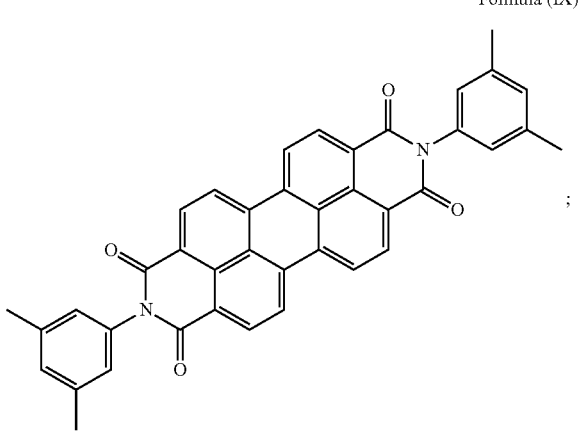
Formula (X)
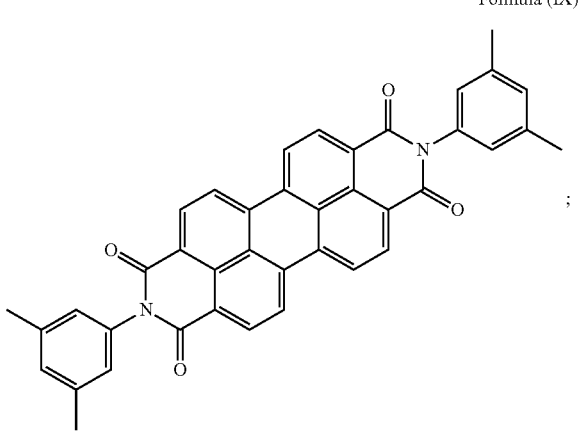

-continued

Formula (XI)

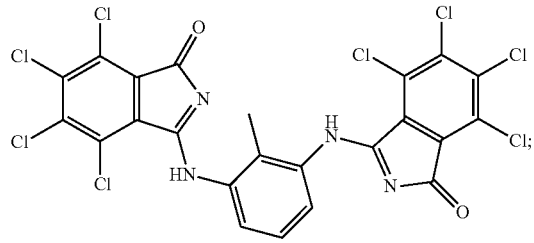

Formula (XII)

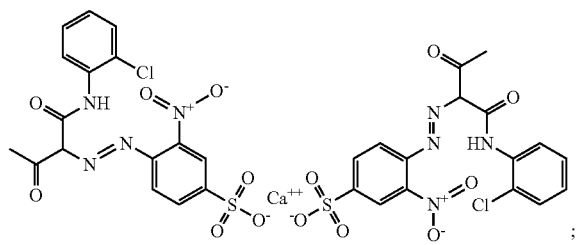

Formula (XIII)

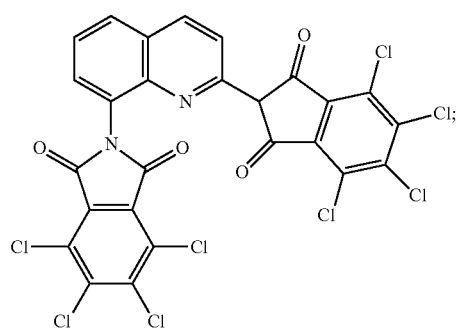

Formula (XIV)

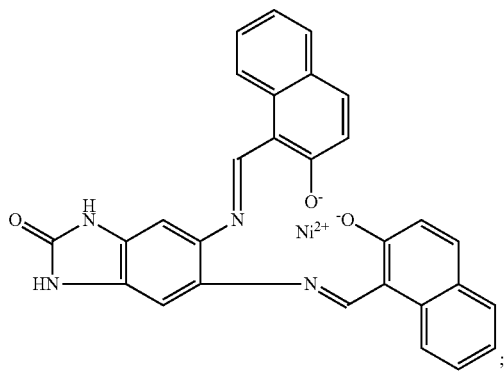

Formula (XV)

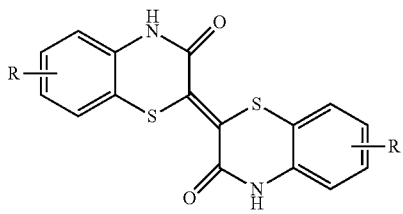

wherein each R is independently selected from H, alkyl, aryl, and halogen; and

Formula (XVI)

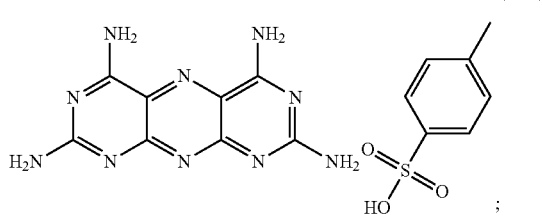

and at least one solvent.

7. The dispensable thermal interface material of claim 6, wherein the solvent is an isoparaffinic fluid.

8. The dispensable thermal interface material of claim 6, wherein the solvent comprises from 1 wt. % to 20 wt. % based on the total weight of a mixture including the thermal interface material and the solvent.

9. The dispensable thermal interface material of claim 6, wherein the dispensable thermal interface material as described above has the viscosity in the range of 10 Pa·s to 100,000 Pa·s.

10. The dispensable thermal interface material of claim 6, wherein the coloring agent is an organic pigment of Formula (I).

11. The dispensable thermal interface material of claim 6, wherein the coloring agent is selected from the group consisting of $\alpha$-$Fe_2O_3$; $\alpha$-$Fe_2O_3 \cdot H_2O$ and $Fe_3O_4$.

12. The thermal interface material of claim 1, wherein the coloring agent comprises a compound of the following formula:

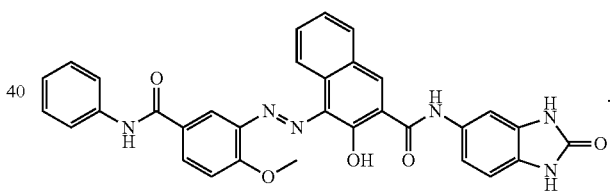

13. The thermal interface material of claim 1, wherein the thermally conductive filler is present in an amount between 75 wt. % and 97 wt. %, based on a total weight of the thermal interface material.

14. The dispensable thermal interface material of claim 6, wherein the coloring agent comprises a compound of the following formula:

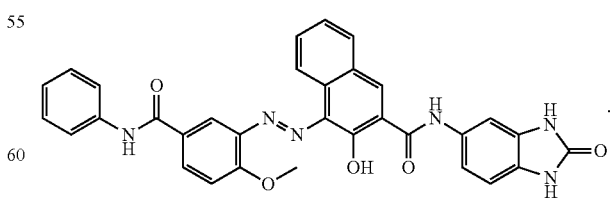

15. The dispensable thermal interface material of claim 6, wherein the thermally conductive filler is present in an amount between 75 wt. % and 97 wt. %, based on a total weight of the thermal interface material.

16. A thermal interface material comprising:
   at least one polymer;
   at least one thermally conductive filler;
   at least one phase change material; and
   at least one coloring agent selected from the group consisting of iron based inorganic pigments and organic pigments.

17. The thermal interface material of claim 16, wherein the iron based inorganic pigment is selected from the group consisting of $\alpha$-$Fe_2O_3$; $\alpha$-$Fe_2O_3 \cdot H_2O$; and $Fe_3O_4$.

18. The thermal interface material of claim 16, wherein the at least one coloring agent has a formula selected from the group consisting of Formulas (I)-(XVI):

Formula (I)
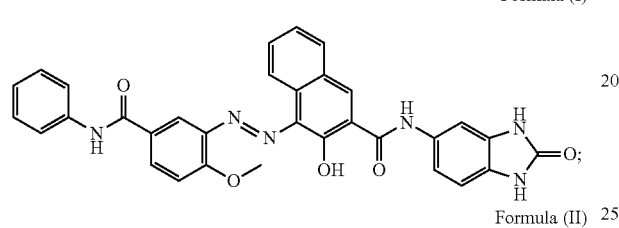

Formula (II)
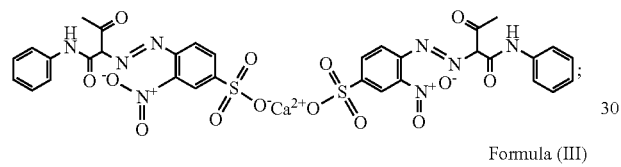

Formula (III)
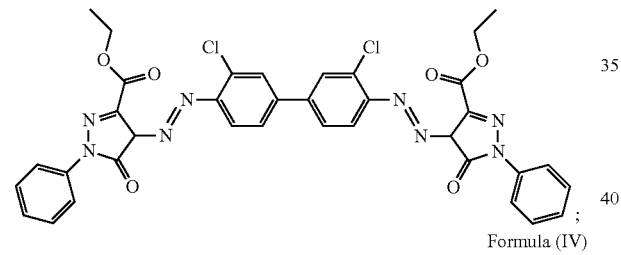

Formula (IV)

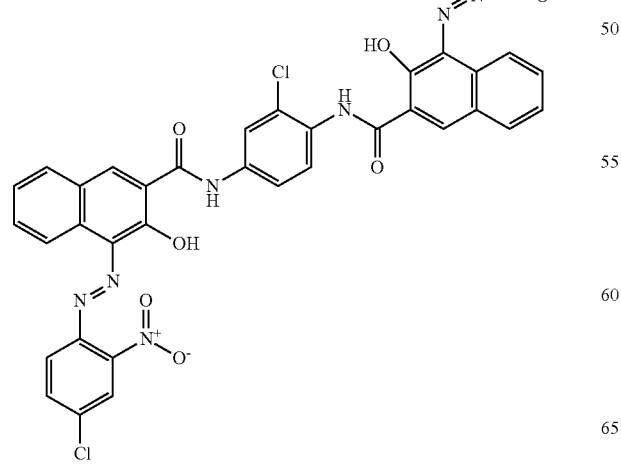

-continued

Formula (V)
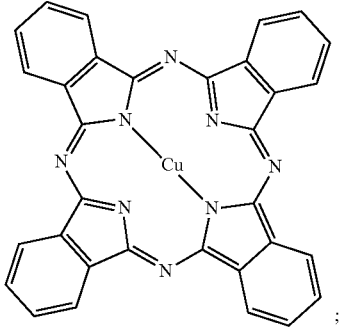

Formula (VI)
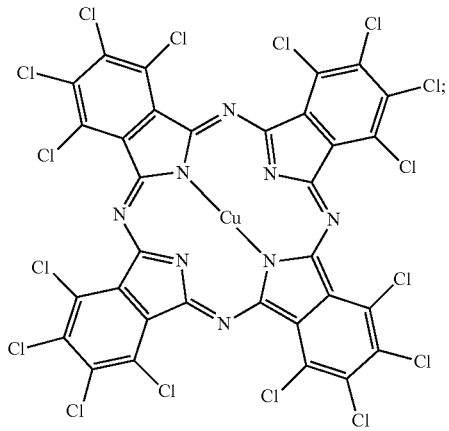

Formula (VII)
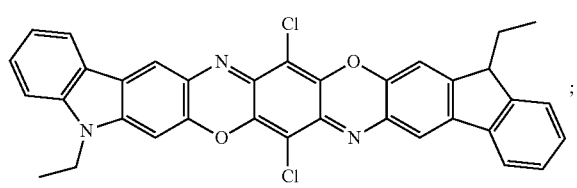

Formula (VIII)
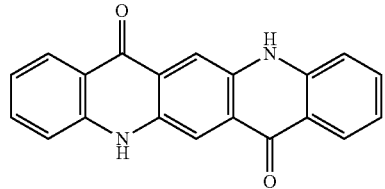

Formula (IX)
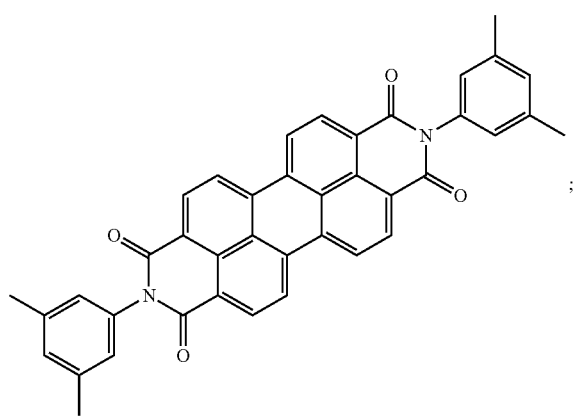

Formula (X)

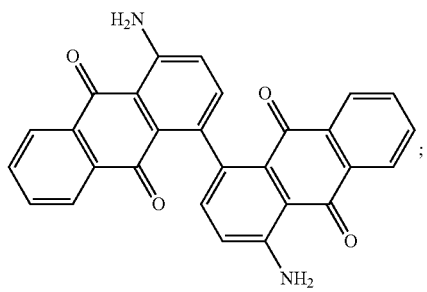

Formula (XI)

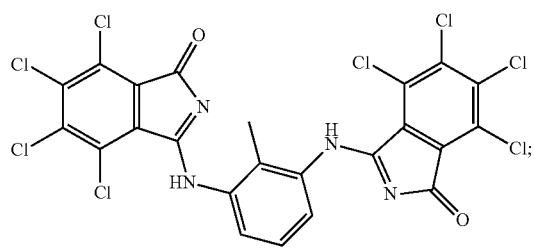

Formula (XII)

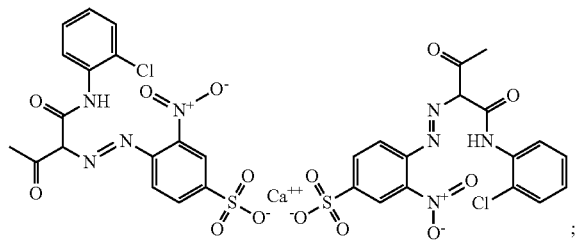

Formula (XIII)

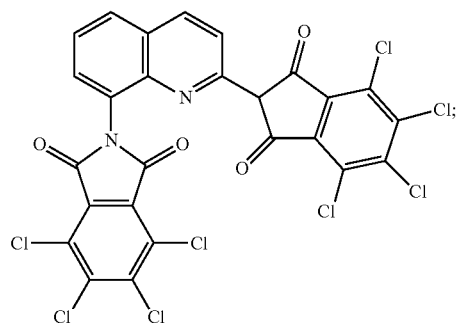

Formula (XIV)

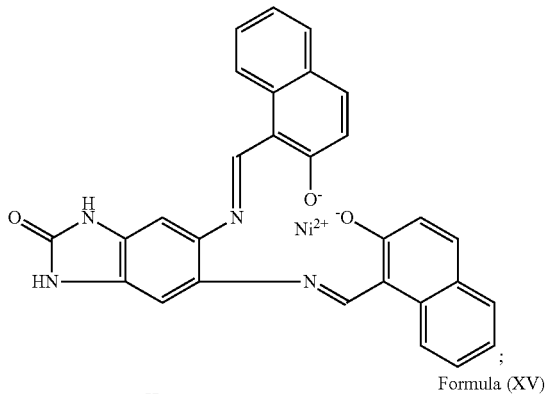

Formula (XV)

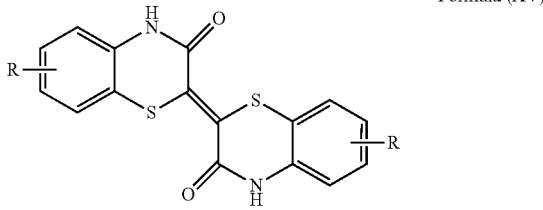

wherein each R is independently selected from H, alkyl, aryl, and halogen; and

Formula (XVI)

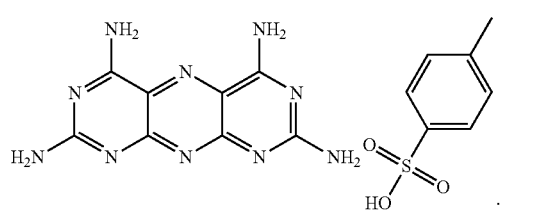

19. The thermal interface material of claim 16, wherein the coloring agent comprises a compound of the following formula:

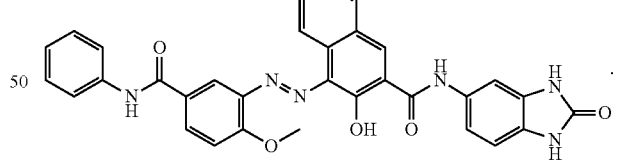

20. The thermal interface material of claim 16, wherein the thermally conductive filler is present in an amount between 75 wt. % and 97 wt. %, based on a total weight of the thermal interface material.

\* \* \* \* \*